United States Patent
Nishihara et al.

(10) Patent No.: US 8,125,123 B2
(45) Date of Patent: Feb. 28, 2012

(54) PIEZOELECTRIC THIN FILM RESONANT ELEMENT AND CIRCUIT COMPONENT USING THE SAME

(75) Inventors: Tokihiro Nishihara, Kawasaki (JP); Motoaki Hara, Kawasaki (JP); Shinji Taniguchi, Kawasaki (JP); Masafumi Iwaki, Kawasaki (JP); Tsuyoshi Yokoyama, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 12/642,048

(22) Filed: Dec. 18, 2009

(65) Prior Publication Data
US 2010/0148636 A1   Jun. 17, 2010

Related U.S. Application Data

(63) Continuation of application No. PCT/JP2008/053920, filed on Mar. 5, 2008.

(30) Foreign Application Priority Data

Jul. 13, 2007   (WO) .................. PCT/JP2007/064015

(51) Int. Cl.
*H01L 41/047* (2006.01)
(52) U.S. Cl. ........ 310/365; 310/321; 310/234; 333/187; 333/189
(58) Field of Classification Search .................. 310/365, 310/324, 321; 333/187, 189
See application file for complete search history.

(56) References Cited

U.S. PATENT DOCUMENTS

| | | | |
|---|---|---|---|
| 6,788,170 B1 | 9/2004 | Kaitila et al. | |
| 6,839,946 B2* | 1/2005 | Ylilammi et al. | 29/25.35 |
| 7,161,448 B2 | 1/2007 | Feng et al. | |
| 7,280,007 B2 | 10/2007 | Feng et al. | |
| 7,567,023 B2 | 7/2009 | Iwaki et al. | |
| 2003/0141946 A1 | 7/2003 | Ruby et al. | |
| 2005/0046519 A1* | 3/2005 | Yokoyama et al. | 333/189 |
| 2005/0248232 A1* | 11/2005 | Itaya et al. | 310/320 |
| 2005/0269904 A1 | 12/2005 | Oka | |
| 2006/0091764 A1 | 5/2006 | Tsutsumi et al. | |
| 2007/0080611 A1 | 4/2007 | Yamada et al. | |
| 2007/0152775 A1* | 7/2007 | Fujii et al. | 333/133 |
| 2007/0207583 A1* | 9/2007 | Burbach et al. | 438/276 |
| 2007/0247260 A1* | 10/2007 | Yanase et al. | 333/187 |
| 2008/0121956 A1* | 5/2008 | Kanaya | 257/295 |
| 2008/0284542 A1* | 11/2008 | Sano et al. | 333/187 |

FOREIGN PATENT DOCUMENTS

| | | |
|---|---|---|
| JP | 2003-505906 A | 2/2003 |
| JP | 2005-045694 A | 2/2005 |
| JP | 2005-73175 A | 3/2005 |
| JP | 2005-109702 A | 4/2005 |
| JP | 2006-5924 A | 1/2006 |
| JP | 2006-050021 A | 2/2006 |
| JP | 2006-109472 A | 4/2006 |
| JP | 2006-128993 A | 5/2006 |
| JP | 2007-110281 A | 4/2007 |
| JP | 2007-300430 A | 11/2007 |

* cited by examiner

*Primary Examiner* — Walter Benson
*Assistant Examiner* — Bryan Gordon
(74) *Attorney, Agent, or Firm* — Chen Yoshimura LLP

(57) ABSTRACT

A piezoelectric thin film resonant element includes a resonant portion having a laminate structure made up of a lower electrode, an upper electrode and a piezoelectric film arranged between these two electrodes. The lower electrode has an ellipsoidal plan-view shape and an outer circumference formed with an inclined portion inclined at an angle (about 30° for example) lying within a range of 25° through 55°. The upper electrode has an ellipsoidal plan-view shape. An additional film is provided on the upper electrode at a portion corresponding to the inclined portion of the lower electrode.

14 Claims, 19 Drawing Sheets

$Z_C < Z_A < Z_B$ $Z_B < Z_A$

PIEZOELECTRIC THIN FILM RESONANT ELEMENT AND CIRCUIT COMPONENT USING THE SAME

TECHNICAL FIELD

The present invention relates to a piezoelectric thin film resonant element of FBAR (Film Bulk Acoustic Resonator) type or SMR (Solidly Mounted Resonator) type, while also relating to a circuit component such as a filter and a branching filter using such a piezoelectric thin film resonant element.

BACKGROUND ART

As is known, a piezoelectric thin film resonant element has a structure in which a piezoelectric film is sandwiched by electrodes on its upper surface and a lower surface, with a cavity or an acoustic multi-layer film provided below the lower electrode. The piezoelectric thin film resonant element converts an electric signal, applied across the upper and lower electrodes to the piezoelectric film, into a mechanical displacement of the piezoelectric film. In addition, the piezoelectric thin film resonant element responds to a mechanical displacement of a specific frequency, depending on the total thickness of the piezoelectric film, the upper electrode and the lower electrode, and also on the cavity below the lower electrode or the acoustic multi-layer film, and then re-converts the mechanical displacement into an electric signal to be outputted outside.

A piezoelectric thin film resonant element provided with a cavity below the lower electrode is called a "FBAR (Film Bulk Acoustic Resonator)" type. A piezoelectric thin film resonant element provided with an acoustic multi-layer film below the lower electrode is called a "SMR (Solidly Mounted Resonator)" type.

An FBAR type piezoelectric thin film resonant element has a basic structure as illustrated in FIG. 22 and FIG. 23, for example. FIG. 22 is a plan view of an FBAR piezoelectric thin film resonant element, and FIG. 23 is a sectional view taken along lines X-X in FIG. 22. The dotted area in FIG. 22 indicates a resonant portion of the piezoelectric thin film resonant element.

A piezoelectric thin film resonant element 100 includes, as primary constituent members, a substrate 101, a lower electrode 102, a piezoelectric film 103, an upper electrode 104, a terminal electrode 102A and a terminal electrode 104A. The lower electrode 102, the piezoelectric film 103 and the upper electrode 104 are rectangular and are laminated on an upper surface of the substrate 101 in this order. The lower electrode 102 and the upper electrode 104 has the substantially same area, and the piezoelectric film 103 has a larger area than that of the lower electrode 102 or the upper electrode 104. The substrate 101 is formed, correspondingly to where the lower electrode 102 and the upper electrode 104 face each other, with a cavity 105 whose opening is slightly larger in area than the mutually facing portion of the two electrodes.

When a high-frequency signal is applied between the upper electrode 104 and the lower electrode 102, an elastic wave is excited in the piezoelectric film 103 due to the inverse piezoelectric effect. The elastic wave includes a wave 106b (hereinafter called "vertically vibrating wave") which vibrates along a plane in the thickness direction (zy plane in FIG. 23) of the piezoelectric film 103, and a wave 106a (hereinafter called "horizontally vibrating wave") which vibrates along a plane which is parallel with the film face (xy plane in FIG. 22) of the piezoelectric film 103.

The vertically vibrating wave 106b is reflected by an end surface of the piezoelectric film 103 on the upper electrode 104 side and by an end surface of the film on the lower electrode 102 side. The reflection induces a resonance inside the piezoelectric film 103, with the vertical elastic wave 106b of a prescribed frequency determined by two factors, i.e. a total thickness H of the piezoelectric film 103, the upper electrode 104 and the lower electrode 102, and a propagation velocity V of the elastic wave which is determined by the materials used in these parts. The vertical elastic wave 106b of the other frequencies is attenuated. Thus, the vertical elastic wave 106b includes a frequency (resonant frequency) f which satisfies the relationship $f=n \times V/2H$ (where n indicates an integer), and the vertical elastic wave 106b of this resonant frequency is re-converted into an electric signal and outputted.

As described above, the piezoelectric thin film resonant element 100 has a system for converting a high-frequency electric signal (electric energy) into an elastic wave (mechanical energy) of a specific frequency by using the inverse piezoelectric effect and the resonance phenomenon based on a mechanical structure, and a system for re-converting the elastic wave (mechanical energy) of the above-described specific frequency into an electric signal (electric energy) of this specific frequency. Of the elastic waves which are generated in the process of electrical-mechanical energy conversion, mechanical energy of the horizontal elastic wave 106a is not very well re-converted into the electric energy, and therefore the horizontal elastic wave 106a causes energy loss in the energy conversion process in the piezoelectric thin film resonant element.

Also, the horizontal elastic wave 106a causes spurious modulation affecting the resonance characteristics of the piezoelectric thin film resonant element 100 and deteriorates amplitude characteristic and phase characteristic of the resonance characteristics. As a result, when a plurality of the piezoelectric thin film resonant elements 100 are combined to provide a filter, ripples appear over the pass band of the filter, and in addition it is likely that the filter's insertion loss, group delay characteristic, etc. are decreased.

Piezoelectric thin film resonant elements are devices which can be utilized suitably in filters for extraction of a specific frequency from high-frequency electric signals. For example, they feature lower loss than those resonant elements which utilize SAW (Surface Acoustic Wave), and they are superior in electric power characteristic, ESD (electro-static discharge) characteristic, etc. For these advantages, there is an increasing demand for use as a constituent part in transmission/reception filters, branching filters, etc. for portable wireless equipment.

Transmission filters and branching filters used in portable wireless equipment or the like are required to achieve low power consumption. Reception filters are required to have a high reception sensitivity requirement. Therefore, the piezoelectric thin film elements are required to achieve a decreased energy loss and to have a high Q value.

With the above-described situation, various methods have been proposed so far, such as a method for increasing the Q value of the piezoelectric thin film resonant element, a method for decreasing energy loss and spurious modulation by suppressing the horizontal elastic wave.

For example, Japanese National Publication No. 2003-505906 (Patent Document 1) and Japanese Lain-open Patent Publication No. 2006-5924 (Patent Document 2) disclose a technique for reducing spurious modulation by making a piezoelectric film 103 of a material which has a dispersion relationship $k(\omega)$ where the wave number k takes a real number in a range where the angular frequency ω is lower than the cutoff frequency $ω_c$, and by configuring an outer edge film thickness of the upper electrode 104 smaller than the film thickness of the inner side portion as illustrated in FIG. 24. Note that FIG. 24 is similar to but is different from FIG. 23 in that the outer edge of the upper electrode 104 is provided with a step 104 a, whose film thickness H2 is smaller than the film thickness H1 of the inner portion. The piezoelectric film 103 which has the above-defined dispersion relationship k(ω) can be provided by with a homogeneous material which has a Poisson's ratio not greater than ⅓, and provided by e.g. aluminum nitride (AlN).

Also, Japanese Lain-open Patent Publication No. 2006-109472 (Patent Document 3) discloses a technique for increasing the Q value of resonance characteristics by making a piezoelectric film 103 of a material which has the above-described dispersion relationship k(ω), and by configuring an outer edge film thickness of the upper electrode 104 larger than the film thickness of the inner side portion as illustrated in FIG. 25. Note that FIG. 25 is similar to but is different from FIG. 23 in that the outer edge of the upper electrode 104 is provided with a projection 104b, whose film thickness H3 is larger than the film thickness H1 of the inner portion.

Meanwhile, Japanese Lain-open Patent Publication No. 2006-128993 (Patent Document 4) discloses a technique for inhibiting leakage of the horizontal elastic wave 106a by removing portions of a piezoelectric film 103 which protrude from the upper electrode 104 as illustrated in FIG. 26. FIG. 26 illustrates the piezoelectric film 103 as having a width (dimension in the y direction) slightly larger than the width of the upper electrode 104. However, this is a drawing technique to clarify that the piezoelectric film 103 exists. The actual width of the piezoelectric film 103 is substantially the same as that of the upper electrode 104.

Japanese Lain-open Patent Publication No. 2006-128993 (Patent Document 4) also discloses a technique for inhibiting leakage of the horizontal elastic wave 106a and thereby improving the Q value of resonance characteristics and an electromechanical coupling coefficient. As illustrated in FIG. 27, an additional electrode 107 is provided in this technique on an upper surface of a terminal electrode 104A of an upper electrode 104. In FIG. 27, a distance D is ensured between a tip of the additional electrode 107 and a tip of the lower electrode 102. This is based on a fact that an overlap made by the tip of the additional electrode 107 and the tip of the lower electrode 102 will result in deterioration of the characteristics. That is, the distance D is ensured to prevent the tips from overlapping in the manufacturing process.

Patent Document 1: Japanese National Publication No. 2003-505906
Patent Document 2: Japanese Lain-open Patent Publication No. 2006-5924
Patent Document 3: Japanese Lain-open Patent Publication No. 2006-109472
Patent Document 4: Japanese Lain-open Patent Publication No. 2006-128993

Japanese National Publication No. 2003-505906, Japanese Lain-open Patent Publication No. 2006-5924 and Japanese Lain-open Patent Publication No. 2006-109472 disclose techniques for decreasing spurious modulation and improving the Q value of resonance characteristics by adjusting the film thickness of the outer edge of the upper electrode 104 of the piezoelectric thin film resonant element 100. In these techniques, however, increasing the film thickness tends to improve the spurious modulation but decrease the Q value of the resonance characteristics, while decreasing the film thickness tends to improve the Q value of the resonance characteristics but aggravate the spurious modulation.

This tendency is understood by referencing FIG. 28. FIG. 28 defines regions and their impedances in the structure in FIG. 25. Specifically, the laminated structure composed of the lower electrode 102, the piezoelectric film 103 and the upper electrode 104 is divided into three regions: Region (B) in which the projection 104b provided at the outer edge of the upper electrode 104 overlaps the lower electrode 102, Region (C) which is outside of Region (B), and Region (A) which is inside of Region (B). Further, acoustic impedances of Regions (A), (B) and (C) are defined as $Z_A$, $Z_B$ and $Z_C$, respectively.

If the projections 104b are provided at the outer edges of the upper electrode 104, since the thickness $H_A$, $H_B$, $H_C$ of Regions (A), (B), (C) are in the relationship $H_C < H_A < H_B$, the acoustic impedances $Z_A$, $Z_B$, $Z_C$ are in the relationship $Z_C < Z_A < Z_B$. Since the acoustic impedance $Z_B$ of Region (B) is larger than the acoustic impedances $Z_A$, $Z_C$ of Regions (A), (C), an acoustic impedance mismatch between Region (A) and Region (C) is increased. Hence, higher-order, symmetric and asymmetric elastic waves of the horizontal mode are reflected by Region (B), and become less likely to leak to Region (C).

As a result, a decrease in the leakage of the horizontal elastic waves near the primary vibration frequency causes improvement of the Q value of resonance characteristics of the piezoelectric thin film resonant element 100. In Region (A), however, due to the reflection of the horizontal elastic waves in Region (B), standing wave of the horizontal elastic wave, which can cause spurious modulation, is likely to be generated. Therefore, the spurious modulation in the piezoelectric thin film resonant element 100 is aggravated.

On the other hand, as illustrated in FIG. 24, if a step is provided at the outer edge of the upper electrode 104, since the thickness $H_A$, $H_B$, $H_C$ of Regions (A), (B), (C) are in the relationship $H_C < H_B < H_A$, the acoustic impedances $Z_A$, $Z_B$, $Z_C$ are the relationship $Z_C < Z_B < Z_A$. Since the acoustic impedance $Z_B$ of Region (B) is between the acoustic impedances $Z_A$, $Z_C$ of Regions (A), (C), respectively, an acoustic impedance mismatch between Region (A) and Region (C) is decreased. Hence, higher-order, symmetric and asymmetric elastic waves of the horizontal mode are more likely to leak to Region (C).

As a result, due to the leakage of horizontal elastic waves from Region (B) to Region (C), the standing wave of the horizontal elastic standing waves, a cause of the spurious modulation, is unlikely to be generated in Region (A). Therefore, the spurious characteristics of the piezoelectric thin film resonant element 100 is improved. However, at the same time, since leakage of the horizontal elastic waves near the main vibration frequency is increased, the Q value of the resonance characteristics of the piezoelectric thin film resonant element 100 is deteriorated.

Hence, simple adjustment such as making the thickness of Region (B) greater than those of Regions (A), (C) or to be between the thickness of Region (A) and that of Region (C) does not achieve improvement of both of the Q value of resonance characteristics and the spurious characteristics of the piezoelectric thin film resonant element 100.

Next, the method, which is disclosed in Japanese Lain-open Patent Publication No. 2006-128993, and in which an additional electrode 107 is provided on an upper surface of the terminal electrode 104A of the upper electrode 104 has the following problem:

Regarding manufacturing a piezoelectric thin film resonant element 100, if the edge of the lower electrode 102a is right-angled, a crack is likely to be formed at the edge portion and the membrane serving forming the resonant portion is likely to be destroyed, whereby reliability is deteriorated. Therefore, an inclined surface 102a is provided at a tip of the lower electrode 102 as illustrated in FIG. 29. Accordingly, an incline is formed in the piezoelectric film 103 formed on the lower electrode 102, and an inclined surface 104c is likely to be formed in the upper electrode 104 formed on the piezoelectric film 103. As a result, the inclined portions in the lower electrode 102, the piezoelectric film 103 and the upper electrode 104 are thinner than the other portions, and the acoustic impedance changes in the inclined portions.

Specifically, as illustrated in FIG. 29, laminated portions constituted of the lower electrode 102, the piezoelectric film 103 and the upper electrode 104 are divided into three regions; i.e. Region (B) in which the slanted surface 102a of the lower electrode 102 faces the slanted surface 104c of the upper electrode 104, Region (C) which is outside the Region (B), and Region (A) which is inside Region (B). The acoustic impedances $Z_A$, $Z_B$ and $Z_C$ of Regions (A), (B) and (C), respectively, are in relationship $Z_C < Z_B < Z_A$.

This magnitude relation between the acoustic impedances is the same as in the case illustrated in FIG. 24 in which a step 104a is provided on the outer edge of the upper electrode 104. The method in which an additional electrode 107 is provided on the upper surface of the terminal electrode 104A of the upper electrode 104 disadvantageously includes a factor which deteriorates the Q value of resonance characteristics in the piezoelectric thin film resonant element 100.

DISCLOSURE OF THE INVENTION

The present invention has been proposed under the above-described circumstances, and it is therefore an object of the present invention to provide a piezoelectric thin film resonant element which has improved resonance characteristics with a higher Q value, reduced spurious frequencies and reduced energy loss, and a circuit component such as a filter and a branching filter using this piezoelectric thin film resonant element.

A first aspect of the present invention provides a piezoelectric thin film resonant element which includes a resonant portion having a laminate structure composed of: a piezoelectric film which has a predetermined plan-view shape; a lower electrode formed on a lower surface of the piezoelectric film and having an outer circumference which includes an inclined portion that is inclined with respect to a surface of the film at a predetermined angle; and an upper electrode which is formed on an upper surface of the piezoelectric film. With this arrangement, an angle of the inclined portion is in a range from 25° through 55°.

It should be noted here that in the above-described piezoelectric thin film resonant element, the inclined portion is preferably provided in part of the outer circumference of the lower electrode.

A second aspect of the present invention provides a piezoelectric thin film resonant element which includes a resonant portion having a laminate structure composed of: a piezoelectric film which has a predetermined plan-view shape; a lower electrode formed on a lower surface of the piezoelectric film and having an outer circumference which includes an inclined portion that is inclined with respect to a surface of the film at a predetermined angle; and an upper electrode which is formed on an upper surface of the piezoelectric film. Further, an acoustic impedance of part of a laminated region in the inclined portion of the lower electrode of the resonant portion is greater than an acoustic impedance of a laminated region inner than the inclined portion of the lower electrode of the resonant portion.

A third aspect of the present invention provides a piezoelectric thin film resonant element which includes a resonant portion having a laminate structure composed of: a piezoelectric film which has a predetermined plan-view shape; a lower electrode formed on a lower surface of the piezoelectric film and having an outer circumference which includes an inclined portion that is inclined with respect to a surface of the film at a predetermined angle; and a lamination thickness in part of the inclined portion of the lower electrode in resonant portion is greater than a lamination thickness of a portion inner than the inclined portion of the lower electrode of the resonant portion by providing a portion of the upper electrode opposing the inclined portion with an additional film.

It should be noted here that in the above-described piezoelectric thin film resonant element, preferably, the upper electrode is provided with a terminal electrode extending from the upper electrode for an external connection, and the additional film is provided on an upper surface of the upper electrode, over a range from the portion opposing the inclined portion to the terminal electrode.

Alternatively, in the above-described piezoelectric thin film resonant element, it is preferable that the upper electrode is provided with a terminal electrode extending from the upper electrode for an external connection, and the additional film is provided in the upper electrode, over a range from a position located on inner than the inclined portion of the lower electrode, passing the portion opposing by the inclined portion, and to the terminal electrode of the upper electrode.

Further, in the above-described piezoelectric thin film resonant element, the additional film may be replaced by a greater film thickness of a portion where the additional film is to be provided than a film thickness of the other portion in the upper electrode so that a greater lamination thickness is achieved in part of the inclined portion of the lower electrode in the resonant portion than a lamination thickness of a portion inner than the inclined portion of the lower electrode of the resonant portion.

Also, in the above-described piezoelectric thin film resonant element, preferably, the piezoelectric film is provided with an inclined portion which is inclined with respect to the surface of the film at a predetermined angle, along an outer circumference of the resonant portion which has a substantially equal lamination thickness to a lamination thickness of a portion inner than the inclined portion of the lower electrode in the resonant portion. With this arrangement, the piezoelectric film has an outer circumference inside of an outer circumference of the upper electrode.

In the piezoelectric thin film resonant element provided by the second or the third aspect of the present invention, preferably, the angle of the inclined portion is in a range from 25° through 55°.

In the piezoelectric thin film resonant element provided by the first through the third aspect of the present invention, preferably, the piezoelectric film is provided by aluminum nitride or zinc oxide which has an orientation with a main axis in a (002) direction.

A fourth aspect of the present invention provides a circuit component which includes at least one of the piezoelectric thin film resonant elements according to the present invention.

BEST MODE FOR CARRYING OUT THE INVENTION

Preferred embodiments of the present invention will be described below with reference to the drawings.

Figure 1:
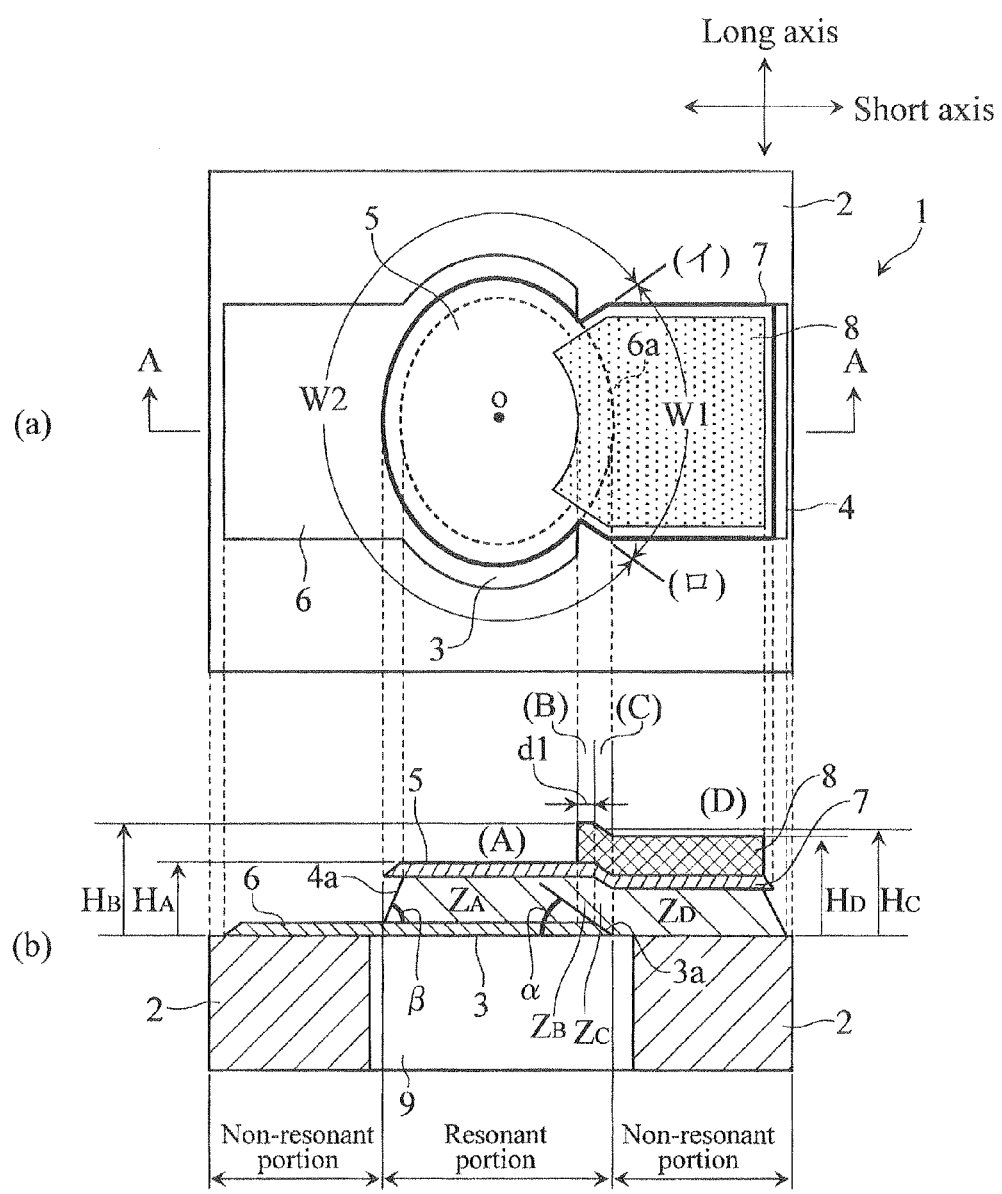
FIG. 1 illustrates a basic structure of a first embodiment of a FAR type piezoelectric thin film resonant element according to the present invention; (a) is a plan view whereas (b) is a sectional view taken in lines A-A in (a).

FIG. 1 illustrates a basic structure of a first embodiment of a piezoelectric thin film resonant element according to the present invention. In FIG. 1, (a) is a plan view whereas (b) is a sectional view taken in lines A-A in (a) in the figure. Although the additional film 8 is illustrated slightly inside a terminal electrode 7 in FIG. 1 (A), this is just a drawing technique to clarify that the terminal electrode 7 exists. The actual size of the additional film 8 is substantially the same as that of the terminal electrode 7. Also, an upper electrode 5 and the terminal electrode 7 are drawn in heavy lines for easy visual recognition, and the additional film 8 is distinguished by a dotted pattern. These illustrative features are common in all of the relevant plan views.

The piezoelectric thin film resonant element 1 illustrated in FIG. 1 is of FBAR (Film Bulk Acoustic Resonator) type. The piezoelectric thin film resonant element 1 includes, as primary constituent members, a substrate 2, a lower electrode 3, a piezoelectric film 4, an upper electrode 5, a terminal electrode 6, a terminal electrode 7 and an additional film 8.

The lower electrode 3 is ellipsoidal. The terminal electrode 6 extends along the short or minor axis of the ellipsoid at an ellipsoidal edge of a half ellipsoid (the edge of the left half in FIG. 1) of the two halves defined by the long or major axis. Likewise, the upper electrode 5 is ellipsoidal, and the terminal electrode 7 extends along the short axis of the ellipsoid at an edge of a half ellipsoid (the edge of the right half in FIG. 1) of the two halves defined by the long axis. Therefore, the lower electrode 3 and the terminal electrode 6 form a somewhat key-hole shaped electrode film member as a whole whereas the upper electrode 5 and the terminal electrode 7 also form a key-hole shaped electrode film member as a whole.

The portion of the lower electrode 3 which constitutes a resonant portion may be destroyed due to e.g. crack development if the electrode edges are right-angled. Therefore, the edges are inclined as illustrated in FIG. 1(b) with respect to the upper surface of the substrate 2. In particular, for the range W1 in FIG. 1(a), which is defined by a clockwise travel from a symbol (i) to a symbol (ii), there is an optimum inclination angle α which prevents horizontal leakage of the elastic wave, and throughout this specific range w1 in the upper electrode 5, the inclination angle α is set to an optimum inclination angle (about 30°, for example) selected from a range of 25° through 55°. The technical significances of selecting the inclination angle α from the specific range of 25° through 55° will be described later.

Since the lower electrode 3 and the terminal electrode 6 are formed integrally in the same patterning process, the inclination angle α of about 30° is provided at the edge of the key-hole shaped electrode film member constituted of the lower electrode 3 and the terminal electrode 6 in the present embodiment.

Similarly to the lower electrode 3 and the terminal electrode 6, the key-hole shaped electrode film member constituted of the upper electrode 5 and the terminal electrode 7 is provided with the inclination angle α of about 30° along the edge. In particular, the inclination angle α for a range W2, which is defined by a counterclockwise travel from a symbol (i) to a symbol (ii), is set to about 30°.

The piezoelectric film 4 has a key-hole shape which is generally the same shape as that of the upper electrode 5 and the terminal electrode 7. The additional film 8 is generally rectangular and has substantially the same shape as the terminal electrode 7. However, the additional film 8 has a slightly extended edge portion on its side orienting to the upper electrode 5 (the edge on the left-hand side in FIG. 1). The extension is slightly beyond the terminal electrode 7, going beyond the inclined portion of the upper electrode 5, and extending by a dimension d1 above the flat portion.

As illustrated in FIG. 1(b), the edge of the piezoelectric film 4 is tilted by an angle β (about 50°-60°, for example) with respect to the upper surface of the lower electrode 3. It should be noted here that in FIG. 1(b), Although the right side edge of the piezoelectric film 4 is tilted, this inclination is not formed intentionally.

The electrode film of the lower electrode 3 and the terminal electrode 5, the piezoelectric film 4, the electrode film of the lower electrode 5 and the terminal electrode 7, and the additional film 8 are laminated on an upper surface of the substrate 2 in this order. At the portion of the substrate 2 at which the lower electrode 3 and the upper electrode 5 face each other, a cavity 9 is provided which has an area of opening slightly larger than the area by which the two electrodes face each other.

The substrate 2 is provided by a silicon (Si) substrate or a glass substrate. The cavity 9 is created by, e.g. dry etching performed to the back surface of the substrate 2 with fluorine-based gas. The cavity 9 may be created by wet etching performed to a sacrifice layer provided on the substrate surface.

The electrode film in each of the lower electrode 3 and the terminal electrode 6 and the electrode film in each of the upper electrode 5 and the terminal electrode 7 are constituted of a metal electrode film which contains aluminum (Al), copper (Cu), molybdenum (Mo), tungsten (W), tantalum (Ta), platinum (Pt), ruthenium (Ru), rhodium (Rh), iridium (Ir), etc. The piezoelectric film 4 is constituted of a thin film made of a homogeneous material which has a Poisson's ratio not greater than ⅓. Examples of the thin film for the piezoelectric film 4 include those using aluminum nitride (AlN), zinc oxide (ZnO), lead zirconate titanate (PZT) and lead zirconate (PbTiO$_3$) which has a main axis oriented in a (002) direction.

The electrode film in each of the lower electrode 3 and the terminal electrode 6, the electrode film in each of the upper electrode 5 and the terminal electrode 7, and the piezoelectric film 4 are formed by steps of film-formation, exposure and etching, for example. The inclined portion 3a in the lower electrode 3 is formed by e.g. ion milling method thereby making an oblique etching to achieve the inclination angle α. Alternatively, the lower electrode 3 may be formed by Ar ion dry etching using a photoresist as a masking material. In this case, the inclination angle α at the edge of the lower electrode 3 is formed to a desired angle by controlling the edge shape of the photoresist. The edge shape of the photoresist can be adjusted by controlling the temperature, time and atmosphere for the heating step which follows a development step. A slope-formed portion 4a (hereinafter called "inclined portion 4a") of the piezoelectric film 4 is formed by wet etching, i.e. the piezoelectric film 4 is etched to a desired inclination angle β.

The additional film 8 is made of a metal film containing gold (Au), titanium (Ti), etc. For example, the additional film 8 is provided by a bilayer film which is composed of a thin film of titanium (Ti) formed as an underlayer, and a thin film of gold (Au) formed on the underlayer. Forming the additional film 8 using a bilayer film of gold (Au) and titanium (Ti) provides a benefit that the bilayer film can serve as an underlayer for formation of bumps used in flip chip mounting. This offers an advantage that the bilayer film formation process does not complicate the manufacturing process.

Next, a resonant operation of the piezoelectric thin film resonant element 1 will be described.

In FIG. 1, the portion where the lower electrode 3, the piezoelectric film 4 and the upper electrode 5 overlap is a portion where the elastic wave resonates (hereinafter called "resonant portion") whereas the other portion is a portion where the elastic waves do not resonate (hereinafter called "non-resonant portion"). Since the portion where the lower electrode 3 and the upper electrode 5 overlap each other is ellipsoidal, the resonant portion is an ellipsoidal portion in the center of the piezoelectric thin film resonant element 1.

As illustrated in FIG. 1(b), the ellipsoidal resonant portion can be divided into four regions along the short axis: Region (C) in which the inclined portion 3a of the lower electrode 3 overlaps the upper electrode 5 and the additional film 8; Region (D) which is located outward of Region (C) and in which the piezoelectric film 4 overlaps the upper electrode 5 and the additional film 8; Region (B) which is located inward of Region (C) and in which the lower electrode 3 overlaps the upper electrode 5 and the additional film 8 (i.e. the region overhung by the edge of the additional film 8 which extends above the upper electrode 5 by the distance d1); and Region (A) which is located inward of Region (B) and in which the lower electrode 3 overlaps the upper electrode 5. Regarding Regions (A), (B), (C) and (D), the film thicknesses are defined as $H_A$, $H_B$, $H_C$ and $H_D$, and acoustic impedances are defined as $Z_A$, $Z_B$, $Z_C$ and $Z_D$, respectively.

Acoustic impedance is expressed by a product of material density and acoustic velocity, and the value is unique to the material to be selected. The acoustic impedance $Z_A$ of Region (A) is a unique value which is determined by the entire portion of the laminated structure constituted of the lower electrode 3, the piezoelectric film 4 and the upper electrode 5; the acoustic impedances $Z_B$, $Z_C$ of Regions (B), (C) are unique values which are determined by the entire portion of the laminated structure constituted of the lower electrode 3, the piezoelectric film 4, the upper electrode 5 and the additional film 8; and the acoustic impedance $Z_D$ of Region (D) is a unique value which is determined by the entire portion of the laminated structure constituted by the piezoelectric film 4, the upper electrode 5 and the additional film 8.

As illustrated in FIG. 1(b), the film thicknesses of Regions (A), (B), (C) and (D) are set to establish the magnitude relation $H_A<H_D<H_C<H_B$. The acoustic impedances are set to establish a similar magnitude relation $Z_A<Z_D<Z_C<Z_B$. Since the acoustic impedances $Z_B$, $Z_C$ of Regions (B), (C) are greater than the acoustic impedances $Z_A$, $Z_D$ of Regions (A), (D), an acoustic impedance mismatch between Region (A) and Region (D) is increased. Accordingly, of horizontal elastic waves propagating radially from the center O of the ellipsoidal resonant portion, higher-order, symmetric and asymmetric elastic waves of the horizontal mode traveling toward the terminal electrode 7 (specifically, horizontal elastic waves which have reached the range W1, which is defined by a clockwise travel from (i) to (ii) in FIG. 1(*a*) ) are reflected at Region (B), and these waves are unlikely to leak to Regions (C), (D).

On the other hand, regarding the range W2, which is defined by a counterclockwise travel from (i) to (ii) in FIG. 1(*a*)), of the ellipsoidal resonant portion, a sectional shape of the piezoelectric film 4, as illustrated in FIG. 1(*b*), includes an edge slanted at the angle β with respect to the upper surface of the lower electrode 3, and the edge of the upper electrode 5 overhangs like an eave. Therefore, the antiresonant impedance of the resonant portion is larger than that in a case where the section does not have such a shape. Therefore, of horizontal elastic waves propagating radially from the center O of the ellipsoidal resonant portion, the horizontal elastic waves reaching the above-described range W2 is prevented from leaking to the non-resonant portion.

As a result, the leakage of the horizontal elastic waves to the non-resonant portion is inhibited, and it is possible to reduce energy loss and to improve the Q value of resonance characteristics of the piezoelectric thin film resonant element 1.

Since the additional film 8 is provided at the outer circumference of the ellipsoidal resonant portion, the frequency of the spurious modulation is changed, depending on the widthwise dimension of the additional film 8. As illustrated in FIG. 1(*a*), the additional film 8 is provided only at a border region of the ellipsoidal resonant portion and the terminal electrode 7, and not provided at the remaining region. Therefore, the frequency of the spurious modulation is different between the area of the resonant portion covered by the additional film 8 (the range W1 covered by the clockwise travel from (i) to (ii) in FIG. 1(*a*)) and the other area of the resonant portion.

In other words, the spurious modulation in the resonant portion is not uniform but unsymmetrical. Hence, in the resonant portion, the spurious modulations at the area with additional film 8 and the area without such a film can cancel out each other, which contributes to the prevention of occurrence of spurious modulation.

While conventional arrangements are not capable of overcoming all the problems relating to the Q value of resonance characteristics, spurious characteristics and energy loss, the piezoelectric thin film resonant element 1 of the present embodiment makes it possible to increase the Q value of resonance characteristics and to reduce spurious modulation.

Since the additional film 8 is made of an electrical conductor, it is possible to decrease the resistance of the upper electrode 5 and the terminal electrode 7, whereby the Q value of the piezoelectric thin film resonant element 1 is improved.

Also, since the additional film 8 is formed over Regions (B), (C) and (D), it is possible to prevent cracks from occurring in the inclined portions of the upper electrode 5 and the terminal electrode 7, and thereby to improve reliability.

Figure 2:
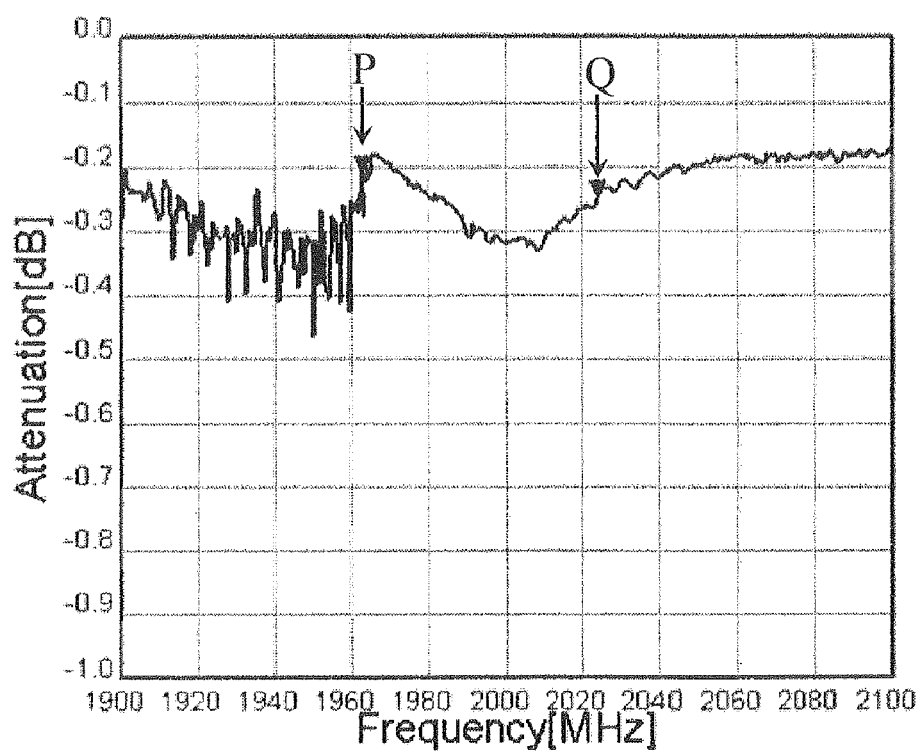
FIG. 2 illustrates a result of return loss measurements in one-port characteristic of a piezoelectric thin film resonant element having a resonant frequency of about 2 GHz, built as a demonstration unit according to the first embodiment.

FIG. 2 illustrates a measurement result of return loss in one-port characteristic of a piezoelectric thin film resonant element 1 having a resonant frequency of about 2 GHz, which was manufactured for the measurement.

The manufactured piezoelectric thin film resonant element 1 includes a a lower electrode 3 and a terminal electrode 6 provided by a bilayer film composed of 240 nm ruthenium (Ru) and 100 nm chromium (Cr), a piezoelectric film 4 provided by a monolayer film of 1150 nm aluminum nitride (AlN), an upper electrode 5 and an terminal electrode 7 provided by a monolayer film of 240 nm ruthenium (Ru); an additional film 8 provided by a bilayer film composed of 500 nm gold (Au) and 100 nm titanium (Ti), which are laminated on a silicon substrate 2. The resonant portion has an ellipsoidal shape with a long axis of 200 μm and the short axis of 165 μm. The inclination angle of the inclined portion 3*a* of the lower electrode 3 is about 30°. The dimension d1 of the extension of the additional film 8 toward the upper electrode 5 is 2 μm.

In FIG. 2, the point P is a resonant frequency $f_p$ (1963 MHz) whereas the point Q is an antiresonant frequency $f_Q$ (2024 MHz). The vertical axis represents attenuation (dB) whereas the horizontal axis represents frequency (MHz).

As the attenuation becomes smaller with reference to 0 dB, the Q value of the piezoelectric thin film resonant element 1 becomes higher. Below the resonant frequency $f_p$, rapid and frequent changes of the attenuation occur, which indicates occurrence of spurious modulation. A smaller amount of variation means a smaller spurious modulation.

Figure 3:
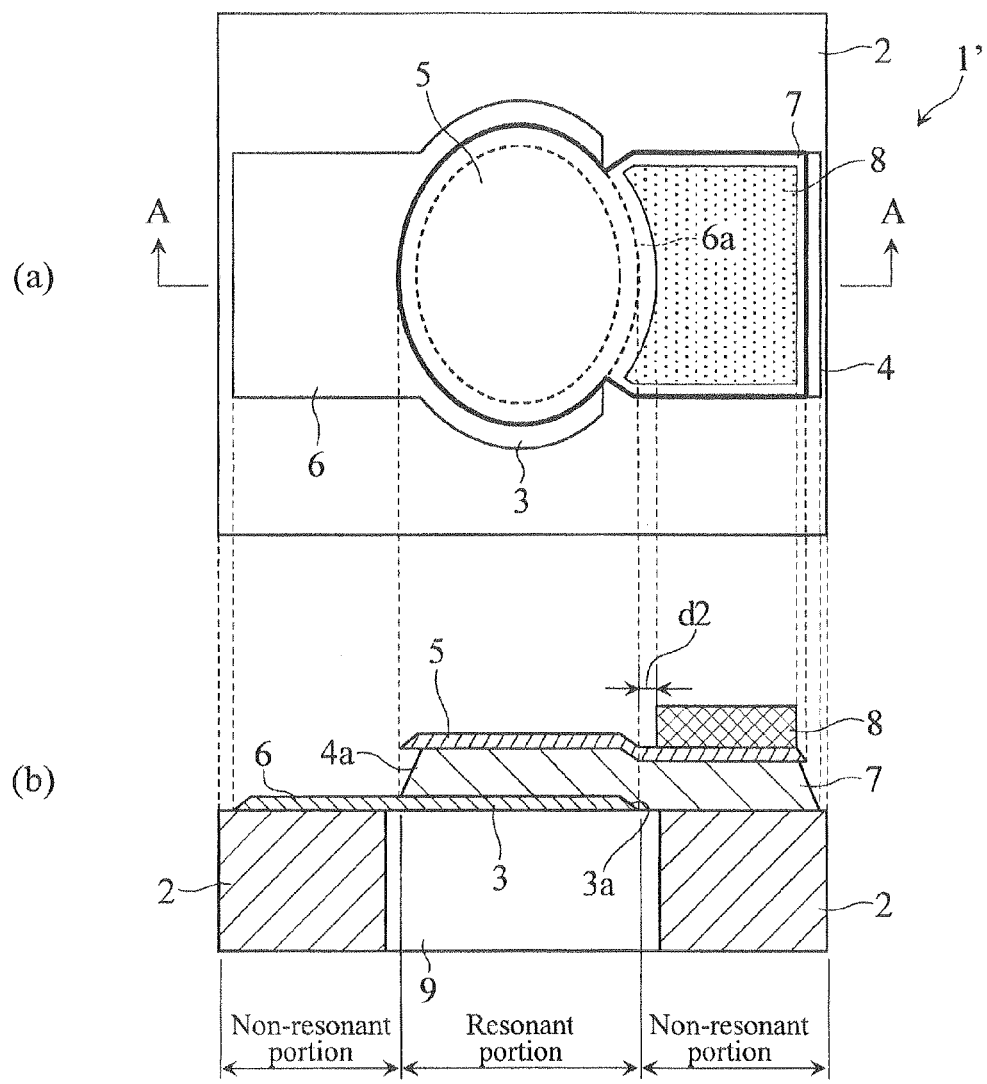
FIG. 3 illustrates a basic structure of a comparative piezoelectric thin film resonant element having a resonant frequency of about 2 GHz.
Figure 4:
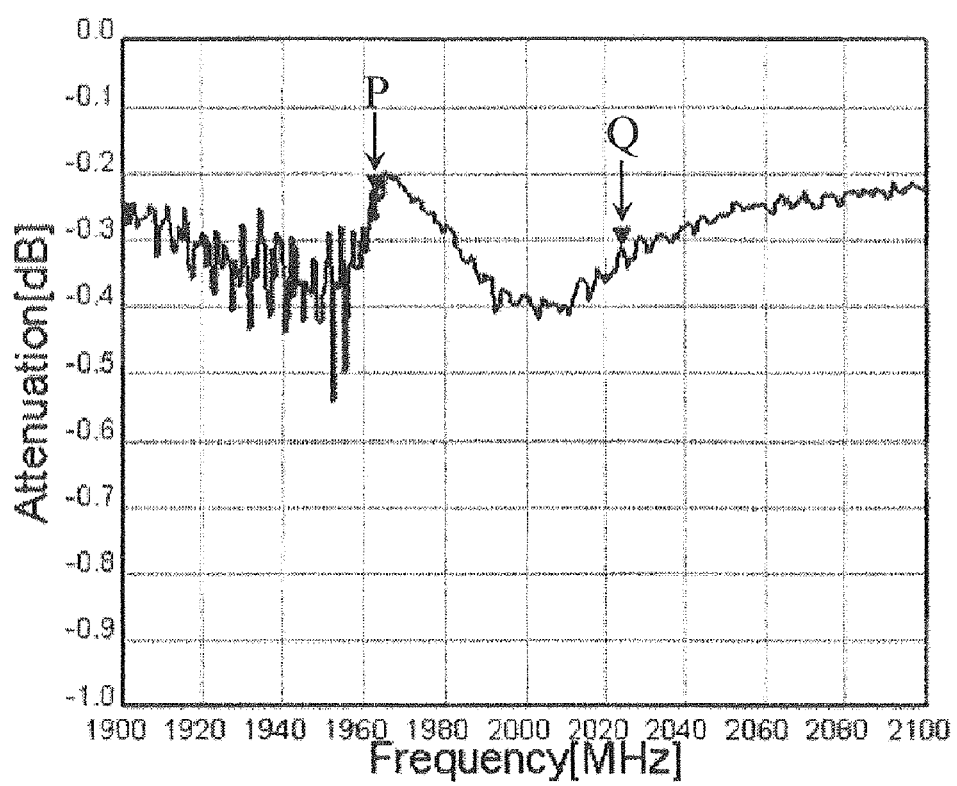
FIG. 4 illustrates a result of return loss measurements in one-port characteristic of the piezoelectric thin film resonant element in FIG. 3.

To evaluate the characteristic of FIG. 2, a comparative piezoelectric thin film resonant element having a resonant frequency of about 2 GHz was manufactured. FIG. 3 illustrates the basic structure of the resonant element. FIG. 4 illustrates the measurement result of return loss in one-port characteristic of the comparative resonant element.

The basic structure of the resonant element depicted in FIG. 3 is the same as that of the piezoelectric thin film resonant element 1 of the first embodiment in FIG. 1, except only that the length of the additional film 8 measured in the short axis direction is different.

Specifically, as seen from FIG. 3(*a*) in comparison with FIG. 1(*a*), the additional film 8 of the conventional piezoelectric thin film resonant element 1' does not extend onto Regions (B) and (C) so that is provided only in an area within Region (D) not to overlap the cavity 9. The dimension d2 of the part where the Region (D) overlaps the cavity 9 is about 5 μm.

As seen from the return loss characteristics in FIG. 2 in comparison with that in FIG. 4, it is understood that the attenuation by the piezoelectric thin film resonant element 1 of the first embodiment is lower by about 0.025 dB at point P (resonant frequency $f_p$), and lower by about 0.06 dB at point Q (antiresonant frequency $f_Q$), and also that the embodiment provides a higher Q value at the respective frequencies. Also, the fluctuation range of the attenuation by the piezoelectric thin film resonant element 1 of the first embodiment is smaller, on average, in the frequency region below the resonant frequency $f_p$, and the spurious modulation is smaller.

Therefore, by utilizing the structure illustrated in FIG. 1 of the FBAR type piezoelectric thin film resonant element 1, it is possible to increase the Q value of resonance characteristics and to reduce spurious modulation.

Next, the technical significance of setting the inclination angle α at a range of 25° through 55° will be described.

Figure 5:
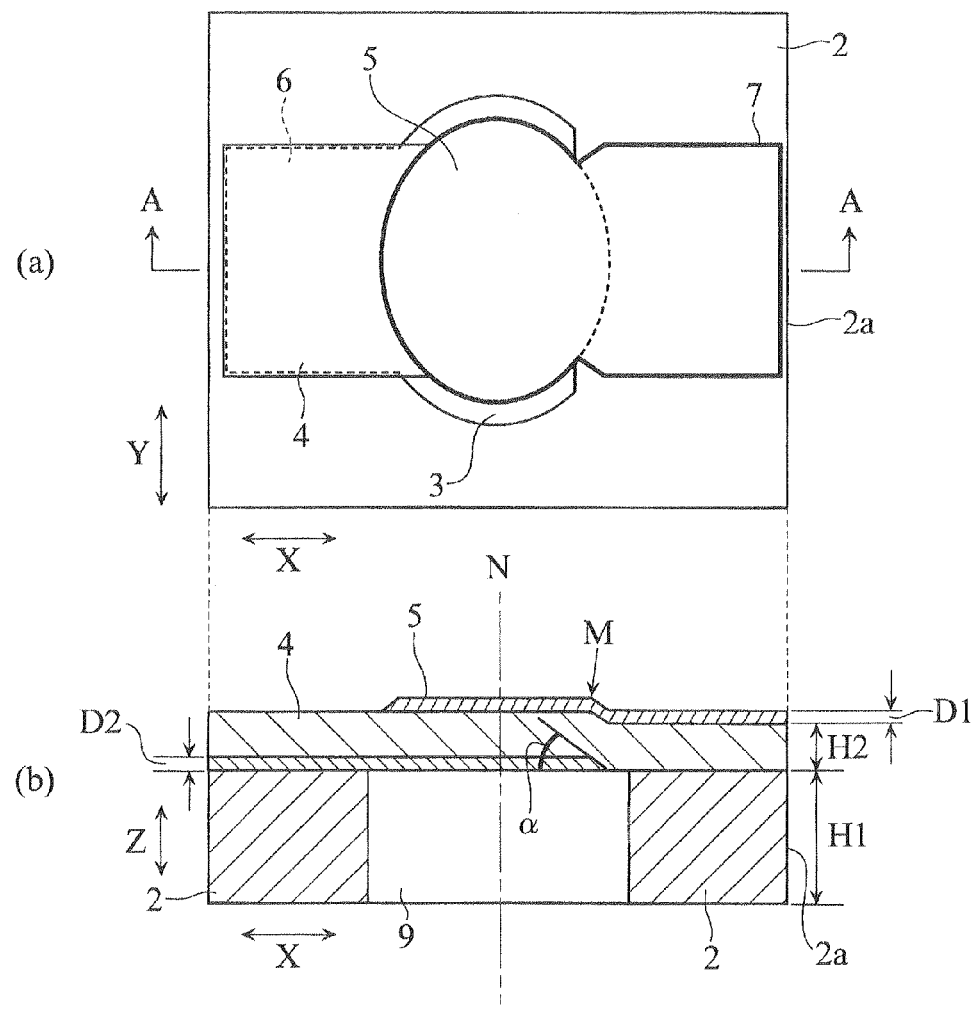
FIG. 5 illustrates a piezoelectric resonant element used as a numerical analysis model for a study on the effect of an incline at an edge of a lower electrode on resonance characteristics of the piezoelectric thin film resonant element.

FIG. 5 illustrates a piezoelectric resonant element used as a numerical analysis model for studying the effect of the edge's inclination of the lower electrode on the resonance characteristics of the piezoelectric thin film resonant element. FIG. 5(*a*) is a plan view, and FIG. 5(*b*) is a sectional view taken in lines A-A, in FIG. 5(*a*).

The piezoelectric thin film resonant element model illustrated in FIG. 5 is the same in basic constitution as the piezoelectric thin film resonant element 1 illustrated in FIG. 1, except that the additional film 8 is not provided, and that the piezoelectric film 4 extends onto the upper surface of the terminal electrode 6. The substrate 2 is made of silicon, the piezoelectric film 4 is made of aluminum nitride, the lower electrode 3, the terminal electrode 6, the upper electrode 5 and the terminal electrode 7 are made of ruthenium. The thickness H of the substrate 2 is 300 μm, the thickness H2 of the piezoelectric film 4 is 1200 nm, the thickness D1 of the lower electrode 3 and the terminal electrode 6 and the thickness D2 of the upper electrode 5 and the terminal electrode 7 are 250 nm.

For simplification, the numerical analysis was performed under the assumptions: that the waves do not travel in the width direction (Direction Y in FIG. 5(a)) of the piezoelectric layer but travels only in the longitudinal and the lateral directions (Directions Z and X in FIG. 5(b)); and that all of the wave energy is absorbed at the right end surface of the piezoelectric layer 4 (the end surface on the right-hand side in FIG. 5) with no reflection occurring. Under the assumptions above, displacement inside the piezoelectric layer 4 was calculated using the finite element method, with piezoelectricity taken into consideration.

Figure 6:
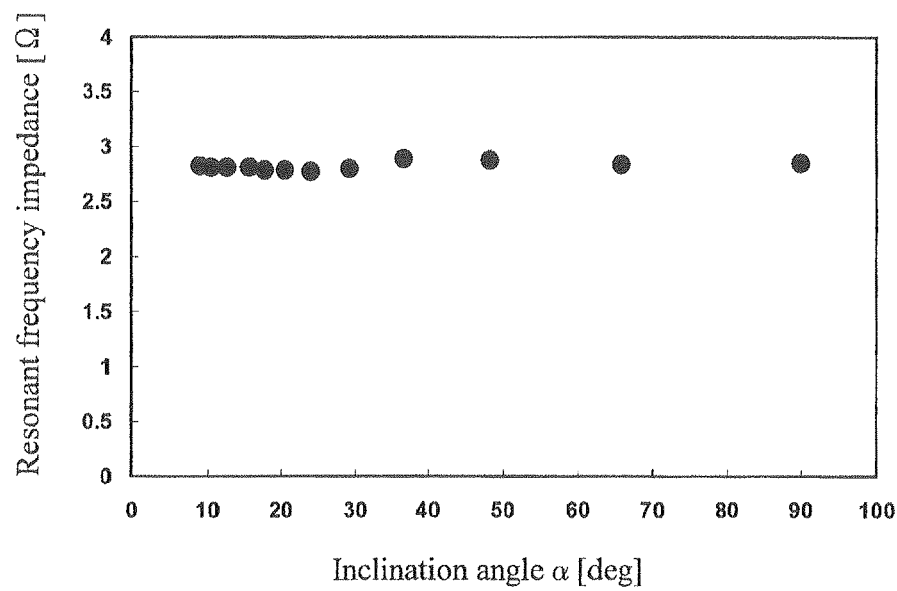
FIG. 6 illustrates a result of resonant frequency impedance calculation performed with a parameter provided by an inclination angle at an edge of a lower electrode.
Figure 7:
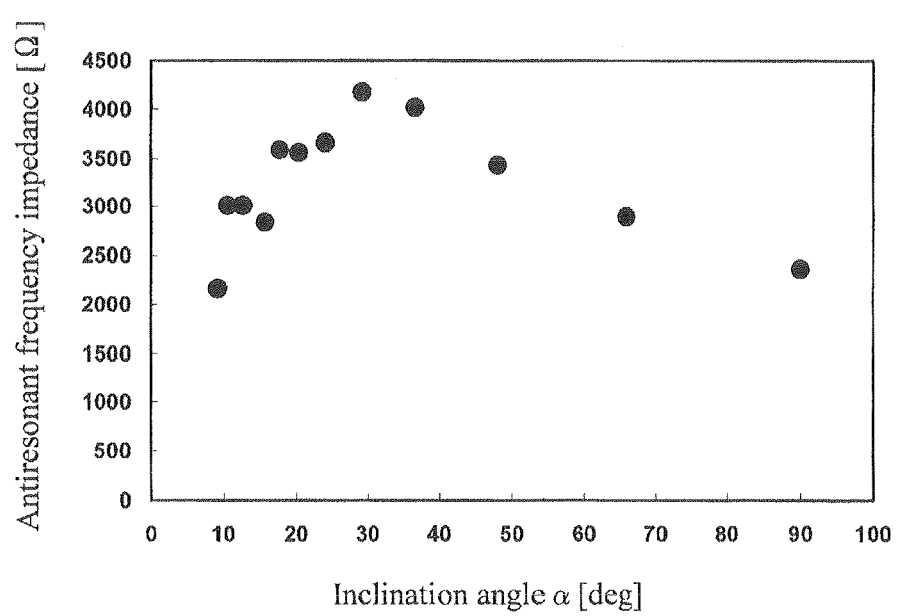
FIG. 7 illustrates a result of antiresonant frequency impedance calculation performed with a parameter provided by the inclination angle at the edge of the lower electrode.

FIG. 6 illustrates a result of calculation of the impedance $Z_{fr}$ (hereinafter called "resonant frequency impedance $Z_{fr}$") at a resonant frequency fr, with a parameter of the inclination angle α at the edge of the lower electrode 3. FIG. 7 illustrates a result of calculation of the impedance $Z_{fn}$ (hereinafter called "antiresonant frequency impedance $Z_{fn}$") at an antiresonant frequency fn, with a parameter of the inclination angle α at the edge of the lower electrode 3.

From FIG. 6 and FIG. 7, it is understood that the resonant frequency impedance $Z_{fr}$ is substantially constant regardless of the inclination angle α, while the antiresonant frequency impedance $Z_{fn}$ is influenced by the inclination angle α and has a local maximum value near 30°.

The antiresonant frequency impedance $Z_{fn}$ is determined by mutual energy exchange between electrostatic energy and kinetic energy inside the piezoelectric film 4, and the value would become infinite under an ideal state in which there is no loss in the process of mutual energy exchange between electrostatic energy and kinetic energy. Actually, however, some loss is inevitable, and therefore the antiresonant frequency impedance $Z_{fn}$ has a finite value. As the antiresonant frequency impedance $Z_{fn}$ is greater, the loss is smaller and the Q value of the resonant element is higher.

As seen from FIG. 7, in the piezoelectric thin film resonant element having the model structure of FIG. 5, the antiresonant frequency impedance $Z_{fn}$ depends on the inclination angle α, and its characteristics has a local maximum value. Hence, it is possible to maximize the Q value by setting the inclination angle α at about 30°, where the antiresonant frequency impedance $Z_{fn}$ takes the local maximum value.

Figure 8:
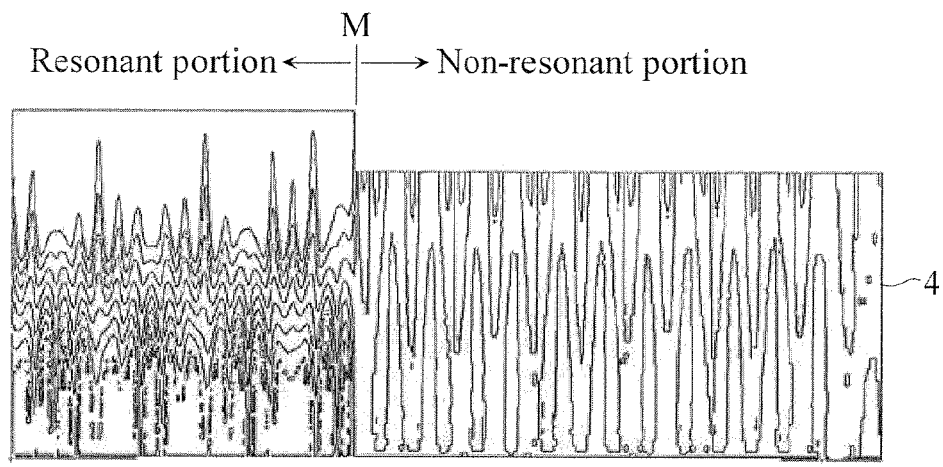
FIG. 8 illustrates a result of numerical analysis of a displacement distribution in a thickness direction of the piezoelectric film at an antiresonant frequency, with the inclination angle of 90°.
Figure 9:
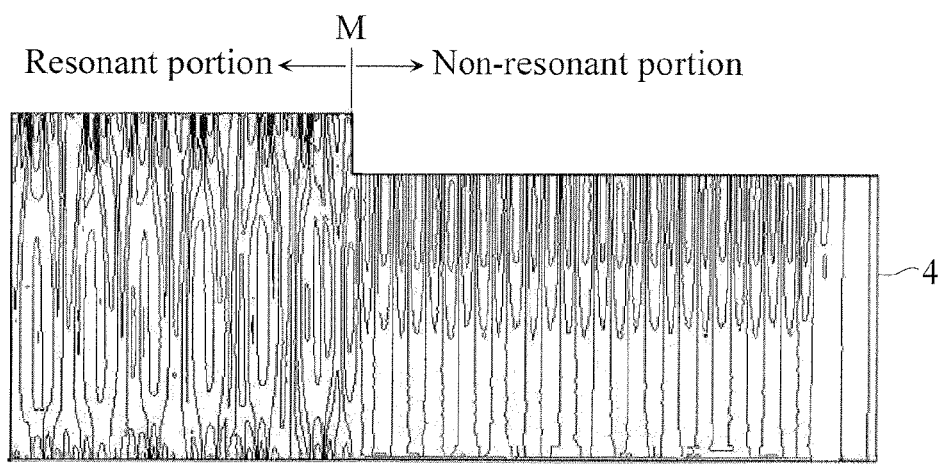
FIG. 9 illustrates a result of numerical analysis of a displacement distribution in a lateral direction of the piezoelectric film at an antiresonant frequency, with the inclination angle of 90°.
Figure 10:
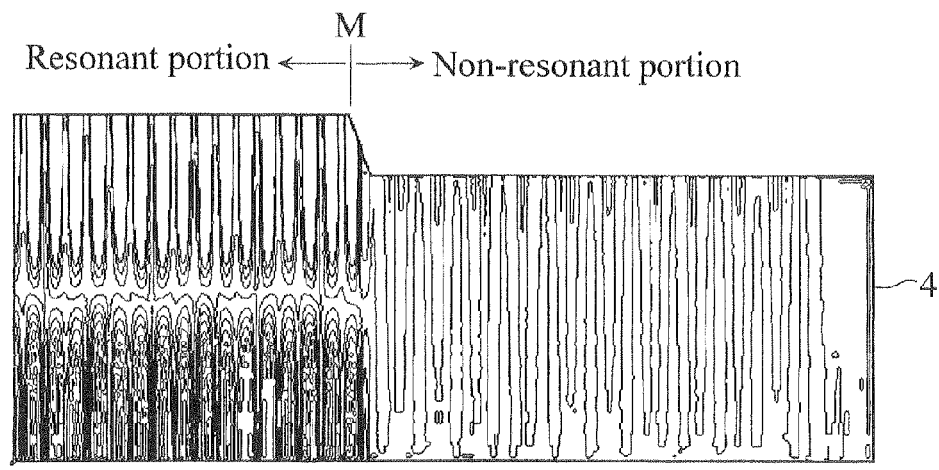
FIG. 10 illustrates a result of numerical analysis of a displacement distribution in the thickness direction of the piezoelectric film at an antiresonant frequency, with the inclination angle of 8°.
Figure 11:
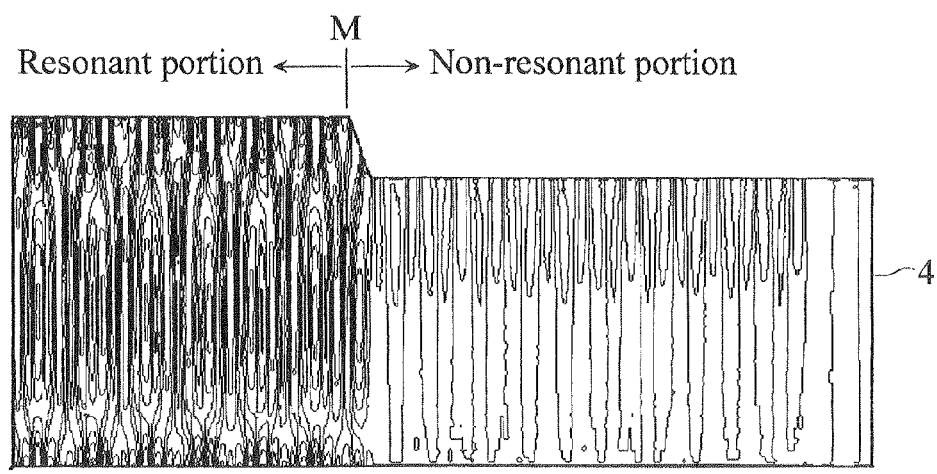
FIG. 11 illustrates a result of numerical analysis of a displacement distribution in the lateral direction of the piezoelectric film at an antiresonant frequency, with the inclination angle of 8°.

FIG. 8 and FIG. 9 illustrate results of numerical analysis of the displacement distribution in the piezoelectric film 4 at the antiresonant frequency fn, with the inclination angle of 90°. FIG. 10 and FIG. 11 illustrate results of numerical analysis of the displacement distribution in the piezoelectric film 4 at the antiresonant frequency fn, with the inclination angle of 8°. It should be noted here that the displacement distribution calculation model used for the piezoelectric film 4 is based on the assumption that in the model of FIG. 5(b), a phantom line N which runs through an approximate center of the resonant portion is a symmetrical boundary, and the boundary surface between the piezoelectric film 4 and the substrate 2 is fixed completely.

FIG. 8 and FIG. 10 illustrate displacement distribution in the thickness direction (in Direction Z in FIG. 5(b)) of the piezoelectric layer 4. FIG. 9 and FIG. 11 illustrate displacement distribution in the lateral direction (in Direction X in FIG. 5(b)) of the piezoelectric layer 4. A symbol M in each of FIGS. 8-11 indicates a position where the inclination starts on the surface of piezoelectric layer 4, and corresponds to a position M in FIG. 5(b). In FIGS. 8-11, the region on the left side of M represents the resonant portion whereas the right-side region represents the non-resonant portion. Stripe patterns in the piezoelectric layer 4 represent contour lines of equal displacement. A dense stripe pattern indicates a large displacement whereas a sparse stripe pattern indicates a small displacement.

From FIG. 10 and FIG. 11, it is understood that displacement in the resonant portion is greater than that in the non-resonant portion in both of the Directions X and Z at the inclination angle of 8°, and that the elastic waves concentrate on the resonant portion. In other words, in the case in which the inclination angle is set to 8°, leakage of the elastic waves generated at the resonant portion to the non-resonant portion is small. On the other hand, from FIG. 8 and FIG. 9, it is understood that in the case where the inclination angle is set to 90°, displacement in Direction Z in the resonant portion is greater than that in the non-resonant portion, but there is no difference between the displacement in Direction X in the resonant portion and that in the non-resonant portion, and that leakage of the elastic waves generated at the resonant portion to the non-resonant portion is large.

Since the piezoelectric thin film resonant element 1 utilizes a thicknesswise (in Direction Z in FIG. 5) vibration (vertical elastic wave), the piezoelectric film 4 has a polarization axis in Direction Z, and converts vibrations (mechanical energy) in Direction Z into electric energy, but vibrations in Direction X (horizontal elastic waves) are not converted into electric energy and become energy loss. Therefore, energy loss in the case in which the inclination angle α is 90° is greater than in the case in which the inclination angle α is 8°.

The displacement distribution analysis in FIGS. 8-11 was performed with respect to two end angles in the characteristics of the antiresonant frequency impedance $Z_{fn}$ in FIG. 7, i.e., 8° and 90° of the inclination α, where at the two angles, the impedance value is generally the same. As seen from the displacement distribution patterns in FIG. 8 through FIG. 11, it is understood that the elastic waves travel in the piezoelectric layer 4 in different propagation modes for the cases of the two angles, i.e. inclination angle 8°, which is smaller than the angle 30° giving a local maximum value, and inclination angle of 90°, which is greater than the angle 30°, suggesting that the propagation mode will change at around the inclination angle 30°.

Figure 12:
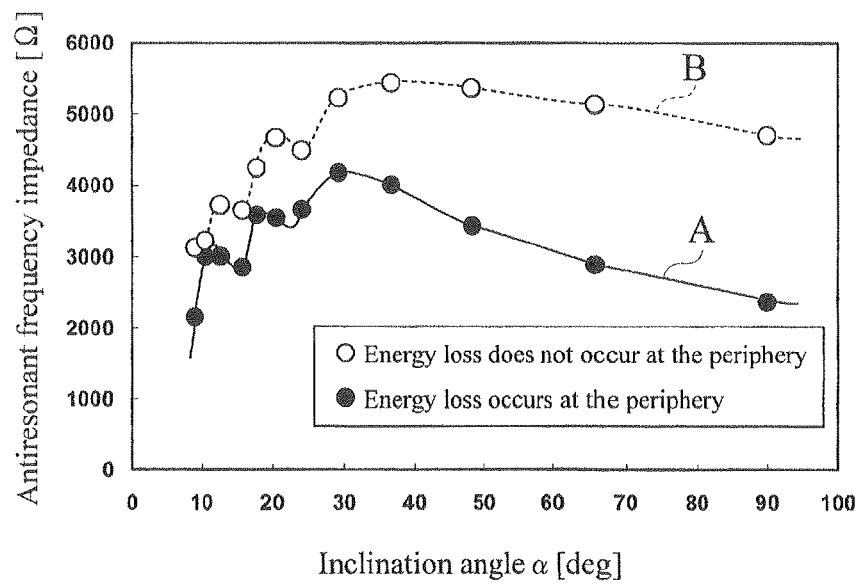
FIG. 12 illustrates two impedance characteristics, one placed on the other; one being the antiresonant frequency impedance characteristic in FIG. 7, and the other being the antiresonant frequency impedance characteristic model in FIG. 5 with the assumption, however, that the end surface on the right side is completely immovable.
Figure 13:
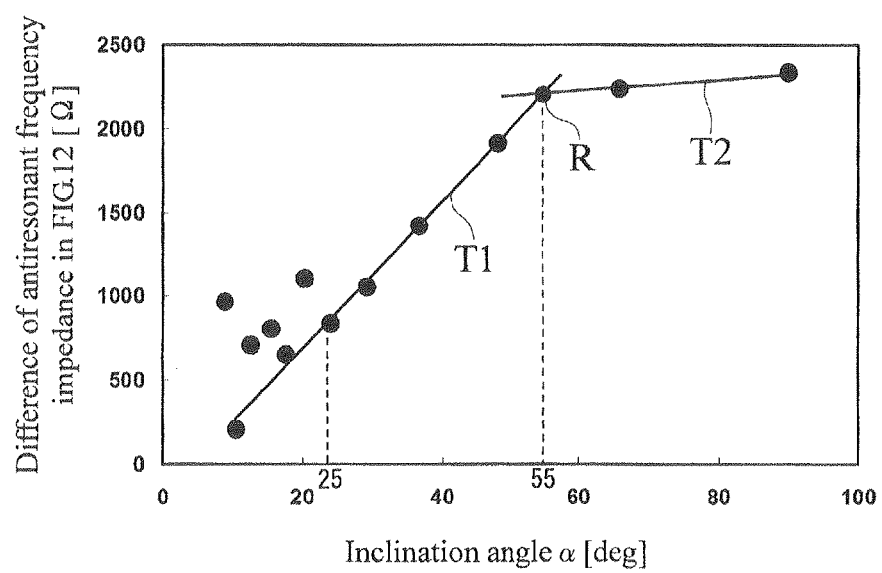
FIG. 13 illustrates a difference characteristic between the two antiresonant frequency impedance characteristics in FIG. 12.

FIG. 12 illustrates two impedance characteristics, where one (A) is the antiresonant frequency impedance characteristic $Z_{fn}$ in FIG. 7 while the other (B) is the antiresonant frequency impedance characteristic model in FIG. 5 with the assumption that the end surface 2a on the right side is fixed completely (i.e., that the elastic waves will be reflected by the end surface 2a). FIG. 13 illustrates the difference between the characteristics B and A illustrated in FIG. 12.

As depicted in FIG. 13, the difference increases substantially linearly as the inclination angle α increases from about 25° to 50°, and then the change becomes substantially flat from 60° to 90°. Line T1 represents the linear change from 25° to 50° whereas Line T2 represents the flat change from 60° to 90°. Line T1 and Line T2 cross with each other at a point R, when the inclination angle α is about 55°.

The difference of the antiresonant frequency impedance $Z_{fn}$ can be approximated by a broken line obtained by connecting Line T1 and Line T2 at the point R. As a result of this approximation, it is understood that the differences of the antiresonant frequency impedance $Z_{fn}$ are rather instable when the inclination angle α is smaller than about 25°, and then become stable when the angle is above 25°. Further, there is a drastic characteristic change between the 25°-55° range and the 55°-90° range.

The linear increase in the above-mentioned 25°-55° range can be attributed to the increasing of leakage of the elastic waves (vibration energy) from the resonant portion where the waves are generated to the non-resonant portion, as the inclination angle α increases (as the edge of the lower electrode 3 becomes steeper). The characteristics becomes flat above 55°, because leakage suppression provided by the edge of the lower electrode 3 becomes no longer effective for reducing the leakage of elastic waves to the non-resonant portion. It gathers, therefore, that it is possible to reduce leakage of the vibration energy to the non-resonant portion when the inclination angle α is set to below 90°, and setting the angle to a value below 55° will make the suppression more effective.

On the other hand, the difference of the antiresonant frequency impedance $Z_n$ becomes unstable when the inclination angle α is below 25°. This is probably because vibrations in Direction X (lateral elastic waves) are exited in the resonant portion. Therefore, setting the inclination angle α in the range from 25° through 55° will achieve excitation suppression of the lateral elastic waves in the resonant portion while accomplishing effective leakage reduction of the longitudinal elastic waves from the resonant portion to the non-resonant portion.

Particularly, it is preferable that the inclination angle α is set to about 30°, since at the inclination angle α of about 30°, the antiresonant frequency impedance $Z_{fn}$ has a local maximum value, as noted with reference to FIG. 7. Such angle setting also contributes to increasing the Q value of the piezoelectric thin film resonant element 1.

In the first embodiment, the additional film 8 is configured to extend from the terminal electrode 7 onto the upper electrode 5 as illustrated in FIG. 1. The formation of the additional film 8 is not limited to this. For example, the additional film 8 may be formed into those shapes illustrated in FIG. 14 through FIG. 16.

Figure 14:
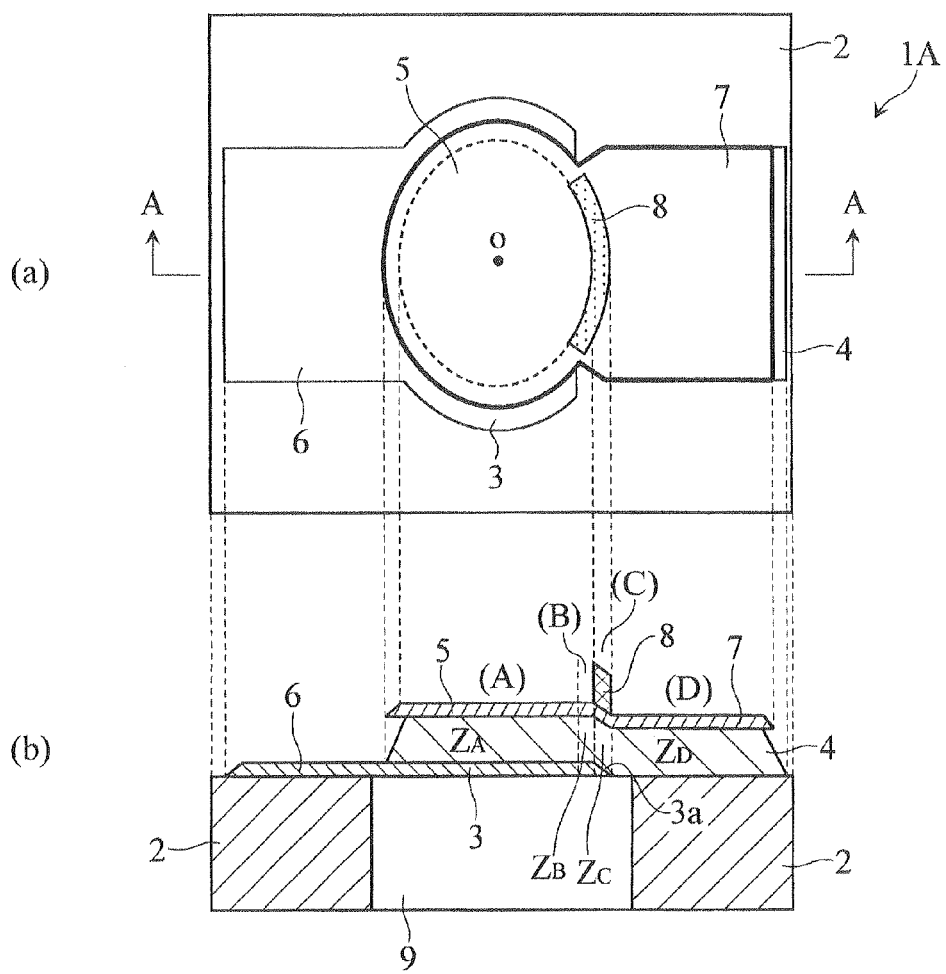
FIG. 14 illustrates a basic structure of a second embodiment of a FAR type piezoelectric thin film resonant element according to the present invention; (a) is a plan view whereas (b) is a sectional view taken in lines A-A in (a).

FIG. 14 illustrates a piezoelectric thin film resonant element 1A according to a second embodiment, whereby the additional film 8 is provided only in Region (C) (the region where the inclined portion 3a of the lower electrode 3 is overlapped by the upper electrode 5).

In the piezoelectric thin film resonant element 1A of the second embodiment, the film thicknesses of Regions (A), (B), (C) and (D) are set to meet the relation $H_D<H_B=H_A<H_C$ as illustrated in FIG. 14(b), and the acoustic impedances are set to meet the relation $Z_D<Z_B=Z_A<Z_C$. In the second embodiment, the acoustic impedance $Z_C$ in Region (C) is greater than the acoustic impedances $Z_A$, $Z_B$ and $Z_D$ in Regions (A), (B) and (D), and therefore the acoustic impedance mismatch between Regions (A), (B) and Region (D) is great. Thus, lateral elastic waves propagate radially from the center O of the ellipsoidal resonant portion, but the higher-order, symmetric and asymmetric elastic waves of the lateral mode traveling toward the terminal electrode 7 are reflected by Region (C) so as not to leak to Region (D).

Thus, the piezoelectric thin film resonant element 1A can achieve reduction in energy loss and increase in the Q value of resonance characteristics. Also, by setting the inclination angle α at the edge of the lower electrode 3 to about 30°, a higher Q value is achieved.

Figure 15:
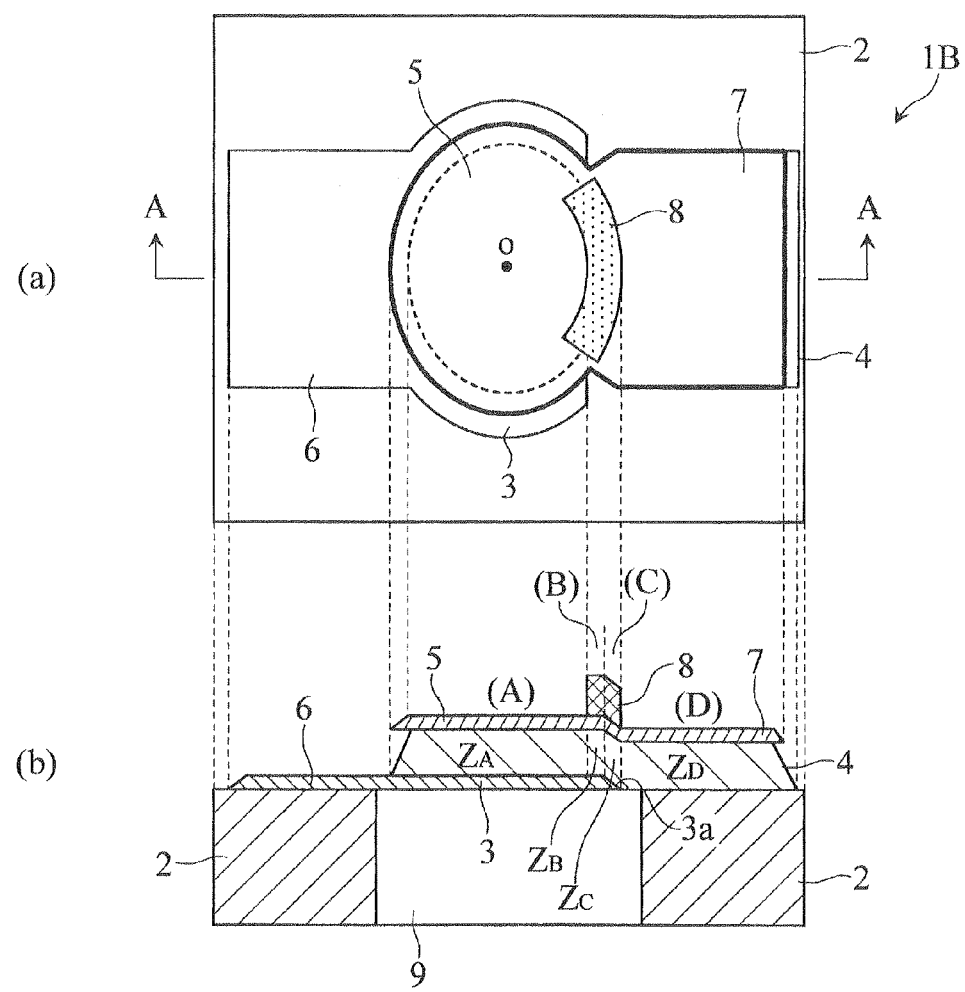
FIG. 15 illustrates a basic structure of a third embodiment of a FAR type piezoelectric thin film resonant element according to the present invention; (a) is a plan view whereas (b) is a sectional view taken in lines A-A in (a).

FIG. 15 illustrates a piezoelectric thin film resonant element 1B according to a third embodiment, whereby the additional film 8 is provided only in Regions (B) and (C) (the region where the inclined portion 3a of the lower electrode 3 is overlapped by the upper electrode 5 and part of the adjacent inner region).

In the piezoelectric thin film resonant element 1 of the third embodiment, the film thicknesses of Regions (A), (B), (C) and (D) are set to meet the relation $H_D<H_A<H_C<H_B$ as illustrated in FIG. 15(b), and the acoustic impedances are set to meet the relation $Z_D<Z_A<Z_C<Z_B$. In the third embodiment as well, the acoustic impedances $Z_B$, $Z_C$ in Regions (B), (C) are greater than the acoustic impedances $Z_A$, $Z_D$ in Regions (A), (D). Therefore, an acoustic impedance mismatch between Region (A) and Region (D) is great, and thus, horizontal elastic waves propagate radially from the center O of the ellipsoidal resonant portion, but the higher-order, symmetric and asymmetric elastic waves of the horizontal mode traveling toward the terminal electrode 7 are reflected by Region (B) so as not to leak to Regions (D).

Therefore, according to the piezoelectric thin film resonant element 1B as well, it is possible to reduce energy loss and increase the Q value of resonance characteristics. Also, by setting the inclination angle α at the edge of the lower electrode 3 to about 30°, a higher Q value is achieved.

Further, since the additional film 8 is formed over the Regions (B), (C), it is possible to prevent cracks from occurring at the inclined portion of the upper electrode 5 and the terminal electrode 7, thereby enhancing the reliability of the device.

Figure 16:
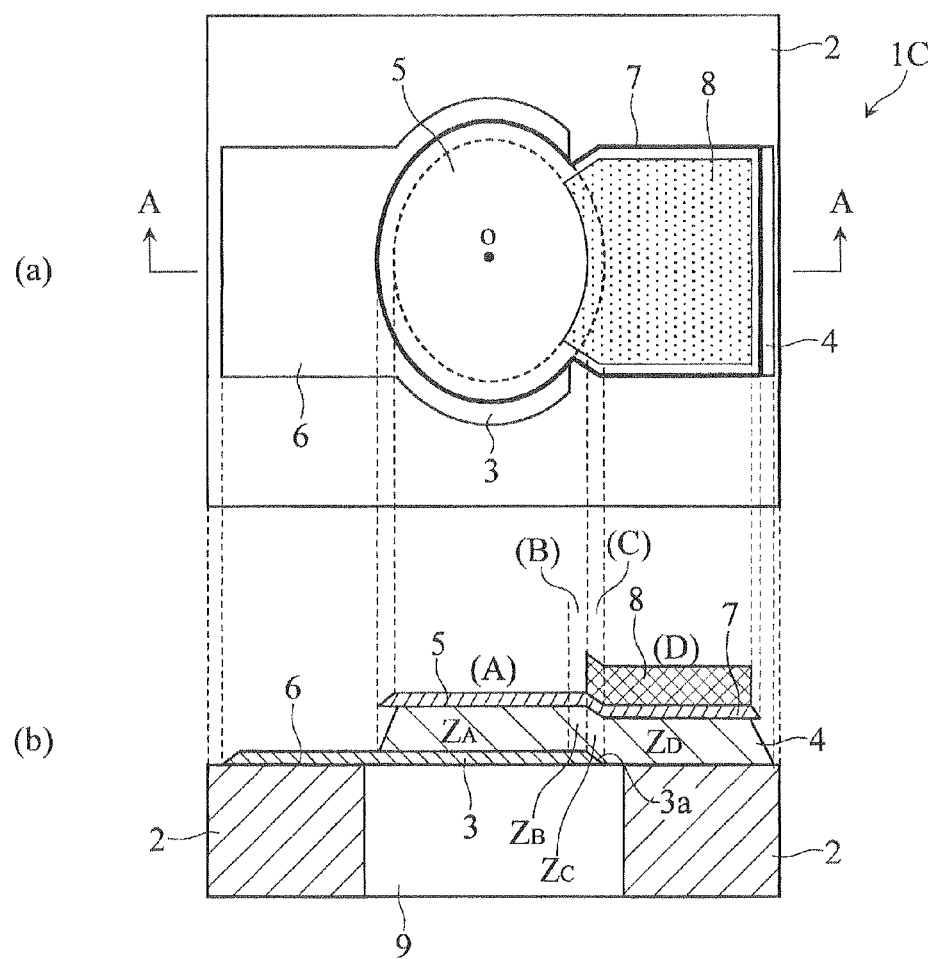
FIG. 16 illustrates a basic structure of a fourth embodiment of a FAR type piezoelectric thin film resonant element according to the present invention; (a) is a plan view whereas (b) is a sectional view taken in lines A-A in (a).

FIG. 16 illustrates a piezoelectric thin film resonant element 1C according to a fourth embodiment, whereby the additional film 8 is provided only in Regions (C) and (D) (the region where the inclined portion 3a of the lower electrode 3 is overlapped by the upper electrode 5 and part of the adjacent outer region).

In the piezoelectric thin film resonant element 1 of the fourth embodiment, the film thicknesses of Regions (A), (B), (C) and (D) are set to meet the relation $H_B=H_A<H_D<H_C$ as illustrated in FIG. 16(b), and the acoustic impedances are set to meet the relation $Z_B=Z_A<Z_D<Z_C$. In the fourth embodiment, the acoustic impedance $Z_C$ in Region (C) is greater than the acoustic impedance $Z_D$ in Region (D) whereas acoustic impedances $Z_A$, $Z_B$ in Regions (A), (B) are smaller than the acoustic impedance $Z_D$ in Region (D). Thus, an acoustic impedance mismatch between Region (A) and Region (D) is great, and consequently, horizontal elastic waves propagate radially from the center O of the ellipsoidal resonant portion, but the higher-order, symmetric and asymmetric elastic waves of the horizontal mode traveling toward the terminal electrode 7 are reflected by Region (C) so as not to leak to Regions (D).

Therefore, according to the piezoelectric thin film resonant element 1C as well, it is possible to reduce energy loss and increase the Q value of resonance characteristics. Also, by setting the inclination angle α at the edge of the lower electrode 3 to about 30°, a higher Q value is achieved.

All of the second embodiment through the fourth embodiment are the same as the first embodiment in that the additional film 8 is provided only at the border area between the ellipsoidal resonant portion and the terminal electrode 7 and is not provided at the other area. Thus, spurious characteristics is suppressed also in the second embodiment through the fourth embodiment due to the same function as in the first embodiment.

In the first embodiment through the fourth embodiment, the additional film 8 may have a preferred thickness to achieve the desired advantage. In the case where the film is provided by Au/Ti, the preferred thickness is Au(200 nm)/Ti (100 nm) or greater. In the first embodiment, optimum values in the additional film 8, i.e. the film thickness and the width d1, are influenced by each other, and in addition they are also dependent upon the resonant frequency, materials, etc. of the piezoelectric thin film resonant element 1. Therefore, these values may preferably be determined based upon simulations such as FEM (Finite Element Method) or by experiments.

Also in the first embodiment through the fourth embodiment, in stead of providing the additional film 8, the thickness of the area of the upper electrode 5 on which the additional film 8 is to be formed may be increased. In other words, the additional film 8 in each of FIG. 1, and FIG. 14 through FIG. 16 is not formed, and instead the area on the upper electrode 5 where the additional film 8 is to be formed is given an increased thickness by the thickness of the additional film 8.

According to the above-described arrangement where the additional film 8 is not formed and the upper electrode 5 is given a partially different film thickness instead, it is still possible to create the magnitude relation described earlier in the acoustic impedances $Z_A$ through $Z_D$ of Regions (A) through (D), and therefore it is possible to achieve the same functions and advantages as described earlier.

Optimum solutions regarding the region where the additional film 8 should be formed or the area where the thickness of the upper electrode should be increased may be determined by simulations such as FEM or by experiments.

The place where the additional film 8 is formed is not limited to the upper surface of the upper electrode 5, but may be an upper surface or a lower surface of the lower electrode 3, or an upper surface of the piezoelectric film 4. The thickness change in Regions (A) through (D) can be achieved not only by changing the film thickness of the upper electrode 5 or of the additional film 8, but also by changing the film thickness of the piezoelectric film 4.

While the description for the first embodiment through fourth embodiment given above covers a FAR type piezoelectric thin film resonant element 1, the present invention is also applicable to SMR type piezoelectric thin film resonant elements.

Figure 17:
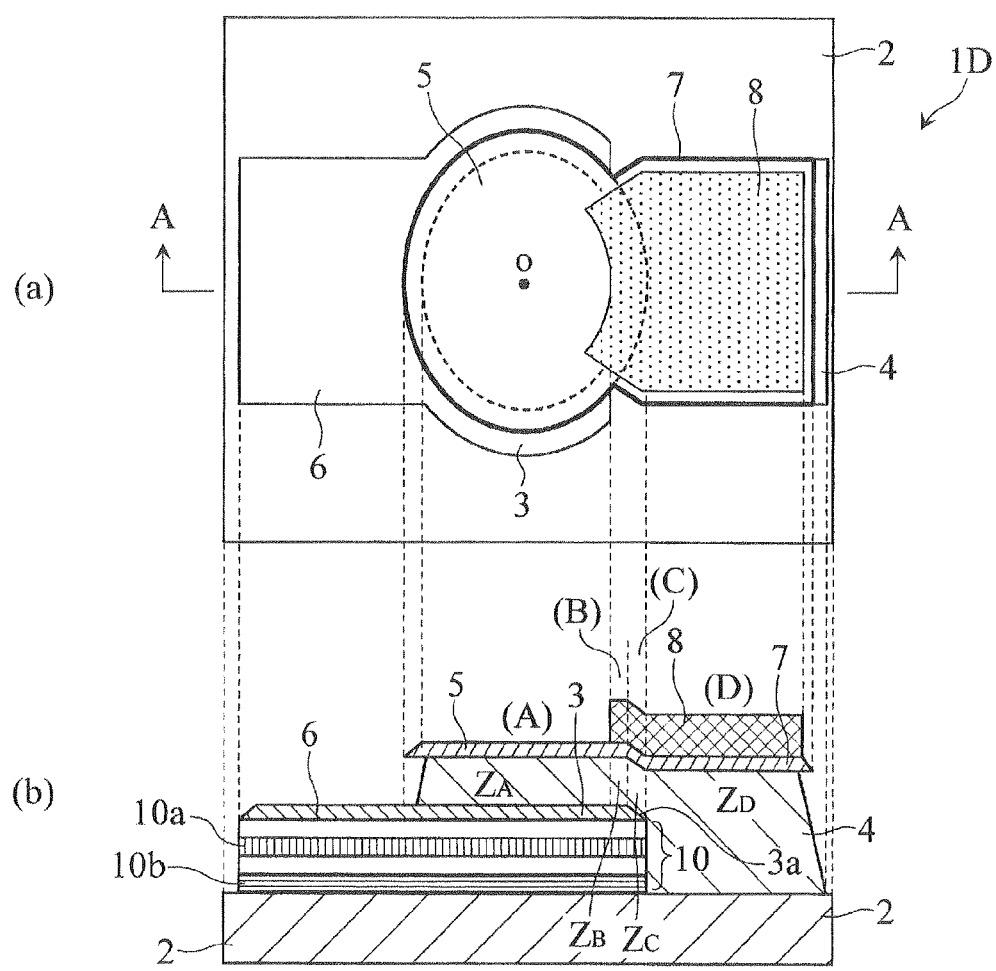
FIG. 17 illustrates a basic structure of an SMR type piezoelectric thin film resonant element according to the present invention; (a) is a plan view whereas (b) is a sectional view taken in lines A-A in (a).

FIG. 17 illustrates a basic structure of an SMR type piezoelectric thin film resonant element which is provided with the additional film 8 according to the first embodiment. In the figure, (a) is a plan view whereas (b) is a sectional view taken in lines A-A in (a).

As is clear from comparison with FIG. 1, the structure in FIG. 17 differs from that in FIG. 1 in that the substrate 2 is not provided with the cavity 9, and an acoustic reflection film 10 is provided between the substrate 2 and the electrode member constituted by the lower electrode 3 and the terminal electrode 6, instead of the cavity 9. As is known, the acoustic reflection film 10 includes a film 10a which has a high acoustic impedance, and a film 10b which has a low acoustic impedance, laminated one after the other in a film thickness of λ/4 (λ is a wavelength of the elastic wave).

According to the SMR type piezoelectric thin film resonant element 1D illustrated in FIG. 17 (hereinafter this embodiment will be called "fifth embodiment") as well, use of the additional film 8 renders the film thicknesses of Regions (A) through (D) set in the magnitude relation expressed in $H_A<H_D<H_C<H_B$, and thus the acoustic impedances are set in $Z_A<Z_D<Z_C<Z_B$. Therefore, it is possible to achieve the same functions and advantages as in the first embodiment.

The additional film 8 in the piezoelectric thin film resonant element 1D according to the fifth embodiment may alternatively be formed in those shapes in FIG. 14 through FIG. 16 which are the shapes used in the second embodiment through the fourth embodiment.

In achieving the advantages provided by the present invention, materials used in the first embodiment through the fifth embodiment for formation of the substrate 2, the lower electrode 3, the piezoelectric film 4, the upper electrode 5, the terminal electrode 6 and the terminal electrode 7 are not limited to those mentioned earlier, but these components may be formed of other materials.

Also, a dielectric film may be provided on the lower side of the lower electrode 3 as, for example, a structural reinforcement member or an etching-stop layer. Also, a dielectric film may be provided on the upper side of the upper electrode 5 as, for example, a passivation film or a frequency adjusting film. Further, the dielectric film(s) provided on the lower side of the lower electrode 3 and/or on the upper side of the upper electrode 5 may be varied in their thickness in order to change the thickness of Regions (A) through (D) in the first embodiment through the fifth embodiment.

In the first embodiment through the fifth embodiment, the resonant portion is ellipsoidal. Instead, however, the shape may be polygonal in which no two sides are parallel to each other. Such polygonal shapes also provide the same functions and advantages as described earlier.

Figure 18:
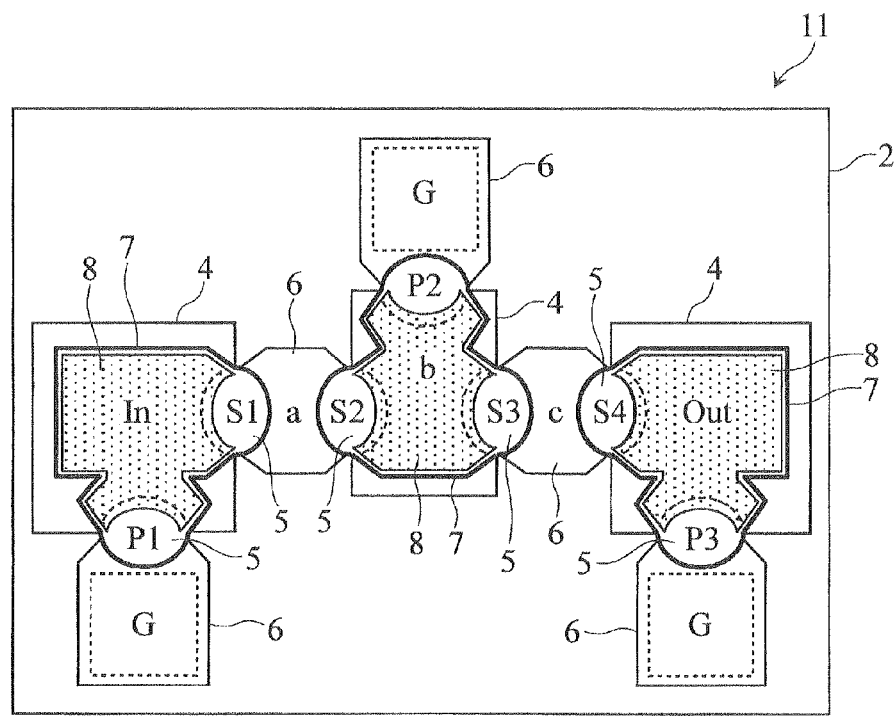
FIG. 18 is a plan view which illustrates a structure of a filter according to the present invention.
Figure 19:
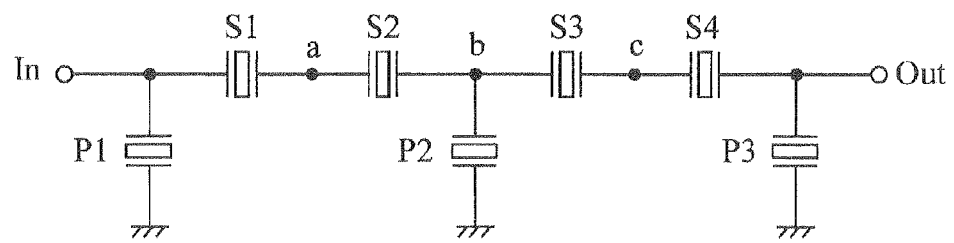
FIG. 19 is an electric circuit diagram of the filter in FIG. 18.

FIG. 18 is a plan view which illustrates a structure of a filter according to the present invention. FIG. 19 is an electric circuit diagram of the filter in FIG. 18. The filter in FIG. 18 and FIG. 19 is a ladder-type band-pass filter consisting of seven piezoelectric thin film resonant elements 1 according to the first embodiment. In FIG. 19, the upper electrodes 5 and the terminal electrodes 7 is illustrated in bold lines and the additional films 8 is illustrated with a dotted pattern for clarity.

This band-pass filter 11 is a four stage ladder-type band-pass filter constituted of a series of four units each provided by two resonant elements connected with each other in an inversed L shape (hereinafter this unit is called "filter unit"). The first-stage filter unit and the second-stage filter unit are connected with each other with their input and output directions inversed to each other whereas the third-stage filter unit and the fourth-stage filter unit are connected with each other with their input and output directions inversed to each other as well. Thus, the parallel resonant element in the second-stage filter unit and the parallel resonant element in the third-stage filter unit are provided by one common element, i.e. a resonant element P2.

In FIG. 18, symbols In, Out, a, b and c correspond respectively to an input and an output terminals In and Out, as well as to connecting points a, b and c in FIG. 19. A symbol G indicates a grounding point. Also, the ellipsoidal upper electrodes 5 are resonant portions, and symbols P1 through P3 and S1 through S4 correspond to resonant elements P1 through P3 and S1 through S4 respectively in FIG. 19.

A series resonant element S1 and a parallel resonant element P1 are connected with each other by the terminal electrode 7 on the upper electrode 5 side, and the series resonant element S1 and the parallel resonant element P1 share the same, integrated terminal electrode 7, which includes an electrode part serving as the input terminal In. Likewise, a series resonant element S4 and a parallel resonant element P3 are connected with each other by the terminal electrode 7 on the upper electrode 5 side, and the series resonant element S4 and the parallel resonant element P3 share the same, integrated terminal electrode 7, which includes an electrode part serving as the output terminal Out.

The series resonant element S1 and the series resonant element S2 are connected with each other by the terminal electrode 6 on the lower electrode 3 side, and the series resonant element S1 and the series resonant element S2 share the same, integrated terminal electrode 6. Likewise, the series resonant element S3 and a series resonant element S4 are connected with each other by the terminal electrode 6 on the lower electrode 3 side, and the series resonant element S3 and the series resonant element S4 share the same, integrated terminal electrode 6. Further, the series resonant element S2, the parallel resonant element P2 and the series resonant element S3 are connected with each other by the terminal electrode 7 on the upper electrode 5 side, and the series resonant element S2, the parallel resonant element P2 and the series resonant element S3 share the same, integrated terminal electrode 7.

Figure 20:
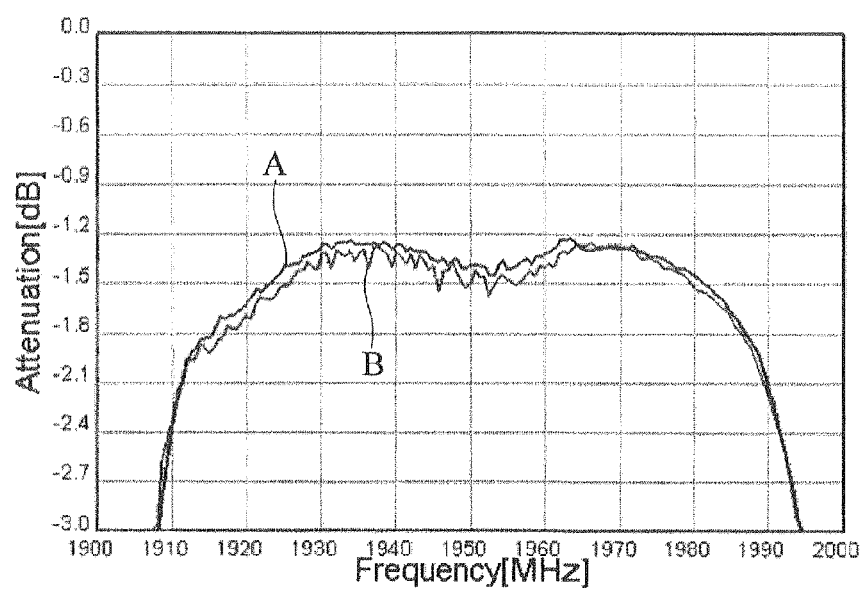
FIG. 20 illustrates a result of bandpass characteristic measurements of the ladder type bandpass filter in FIG. 19.

FIG. 20 illustrates a result of band-pass characteristic measurements performed to a demonstration unit of the ladder type band-pass filter in FIG. 19.

It should be noted here that in the first embodiment, the demonstration unit of the piezoelectric thin film resonant element 1 used in the description of FIG. 2 has the upper electrode 5 and the terminal electrode 7 provided by a monolayer film of 240 nmm ruthenium (Ru). However, in the demonstration unit of the band-pass filter 11, a bilayer film composed of 240 nmm ruthenium (Ru) and 110 nm chromium (Cr) are used to form the upper electrodes 5 and the terminal electrodes 7 of the parallel resonant elements S1 through S4 for providing electrodes serving as the input terminals In, the output terminals Out and the connecting point b.

In FIG. 20, Characteristic A indicates a characteristic of the band-pass filter according to the present invention. Characteristic B indicates a characteristic of a band-pass filter built for a comparative study (hereinafter called "comparative band-pass filter") in which the series resonant elements S1 through S4 and the parallel resonant elements P1 through P3 in FIG. 20 are formed according to the structure of the piezoelectric thin film resonant element illustrated in FIG. 3. In the comparative band-pass filter, the additional films 8 in FIG. 18 are not extended onto the inner side of the respective upper electrodes 5 beyond the terminal electrodes 7.

As illustrated in FIG. 20, the band-pass filter according to the present invention has an improved minimum insertion loss by about 0.1 dB over the comparative band-pass filter (see the range from 1930 MHz through 1970 MHz), achieving a wider range by about 4 MHz at the −1.7 dB band. Also, the band-pass filter according to the present invention has reduced ripples within the band.

As described, use of the piezoelectric thin film resonant element according to the present invention in a filter provides such advantages as reduced insertion loss, reduced ripples and increased range of filtering.

Figure 21:
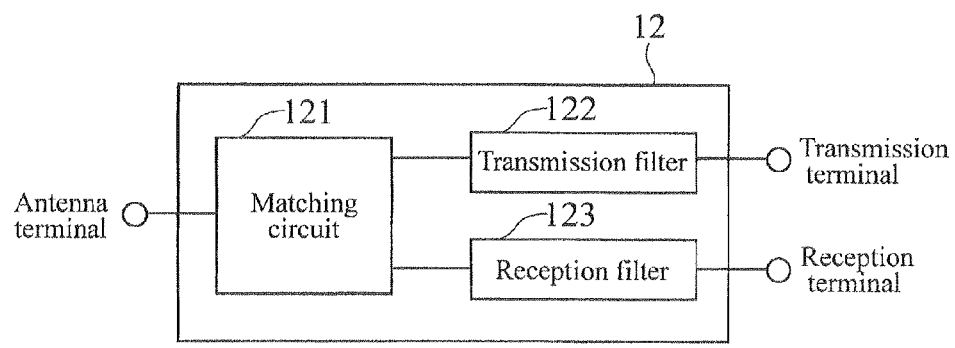
FIG. 21 is a basic block diagram of a branching filter.
Figure 22:
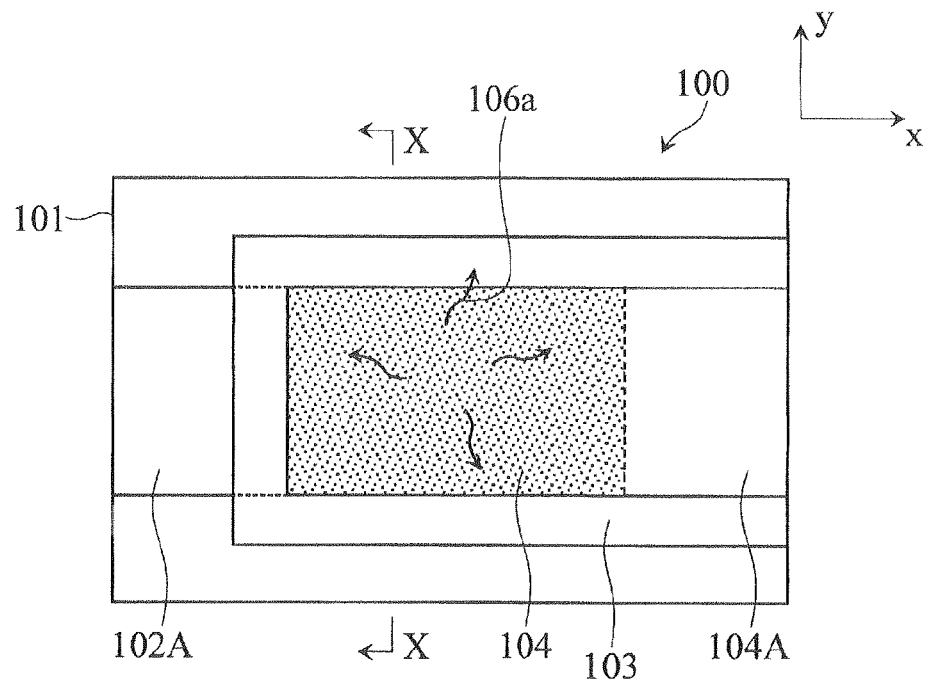
FIG. 22 is a plan view which illustrates a basic structure of a FBAR type piezoelectric thin film resonant element.
Figure 23:
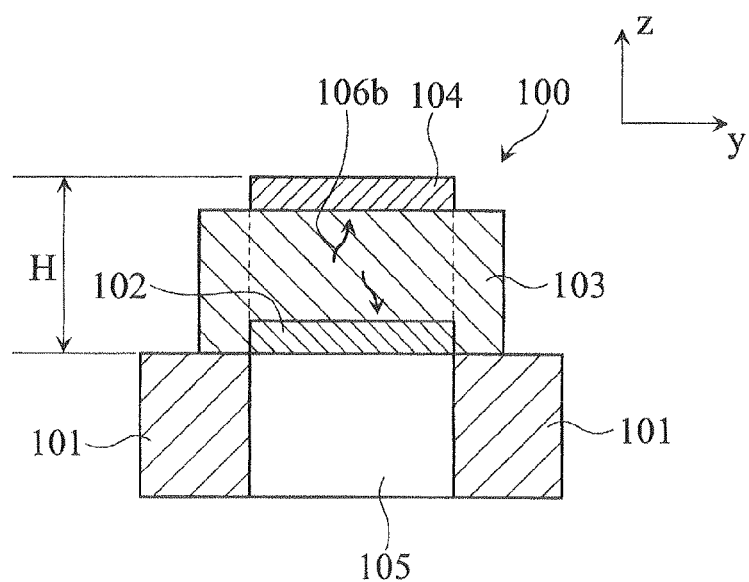
FIG. 23 is a sectional view taken in lines X-X in FIG. 22.
Figure 24:
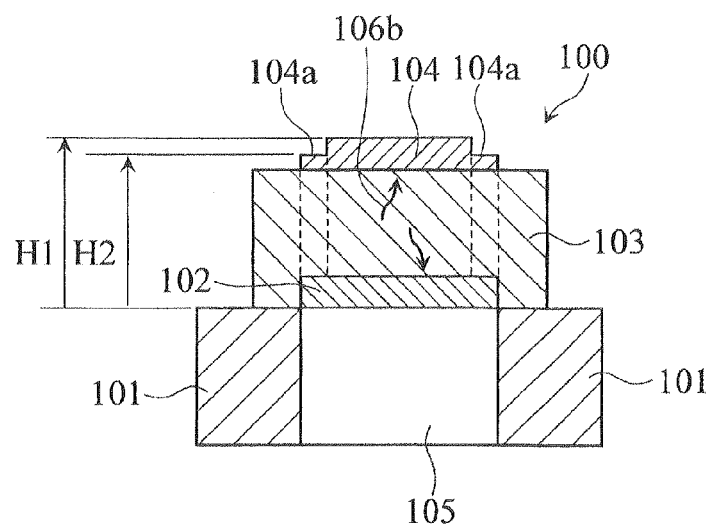
FIG. 24 is a sectional view of a structure designed for reduction of spurious modulation in a conventional FBAR.
Figure 25:
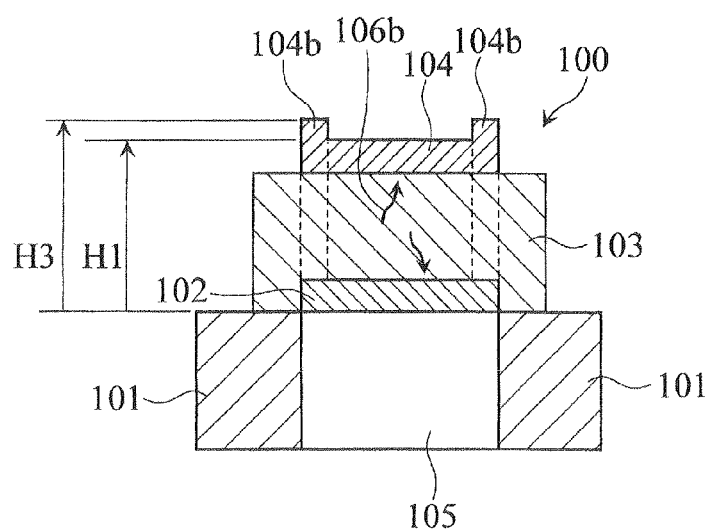
FIG. 25 is a sectional view of a structure for Q value improvement in a conventional FBAR.
Figure 26:
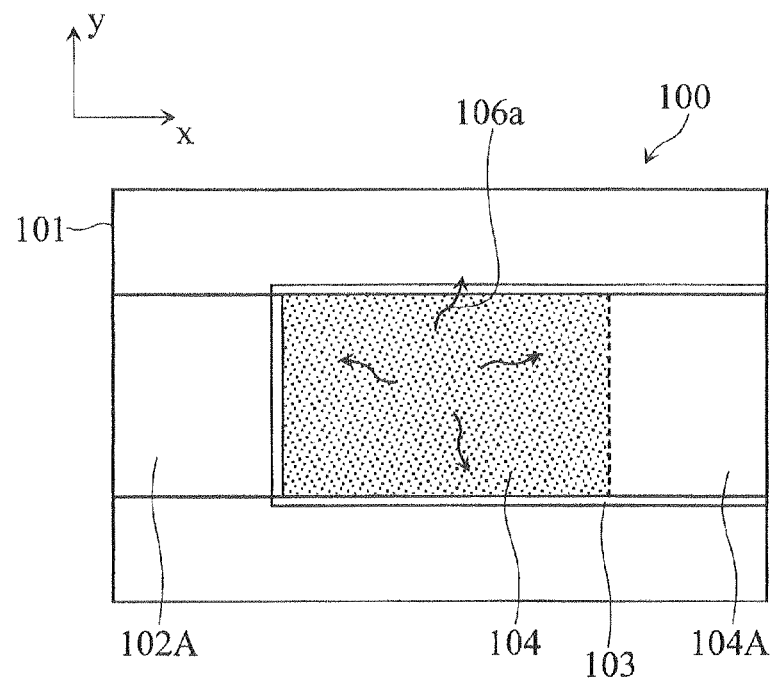
FIG. 26 is a sectional view of a structure for lateral elastic wave leakage reduction in a conventional FBAR.
Figure 27:
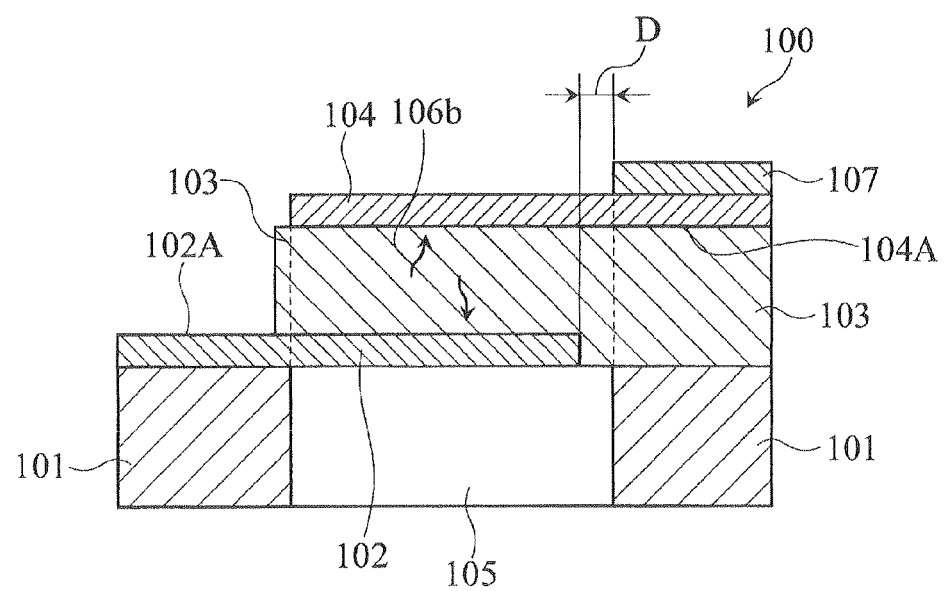
FIG. 27 is a sectional view of a structure for lateral elastic wave leakage reduction aimed at improving on a resonant Q value and an electromechanical coupling coefficient in a conventional FBAR.
Figure 28:
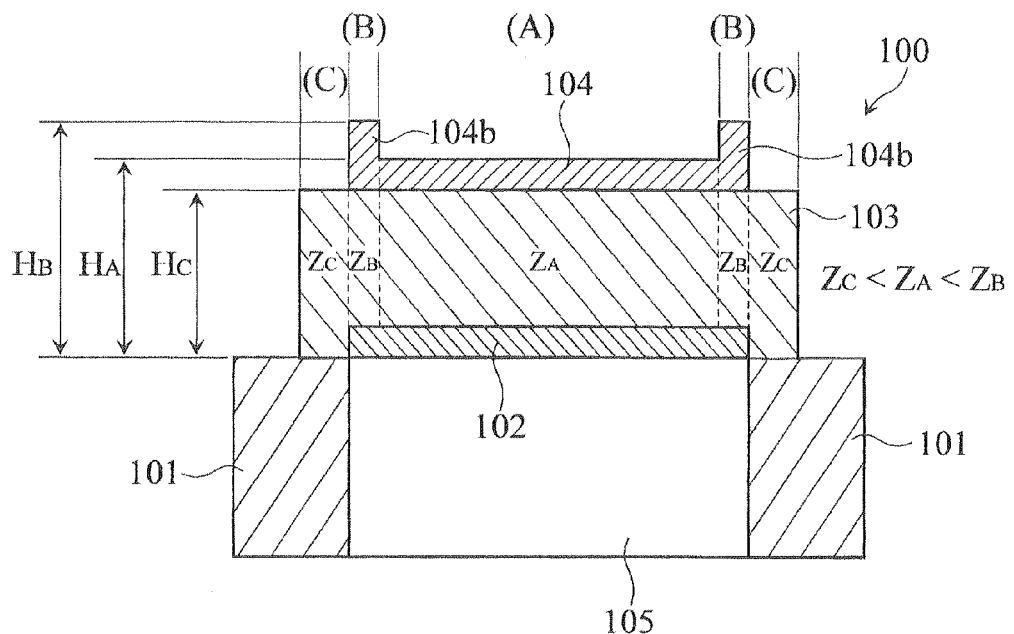
FIG. 28 defines three kinds of regions each having a different acoustic impedance from the others, in the structure illustrated in FIG. 25.
Figure 29:
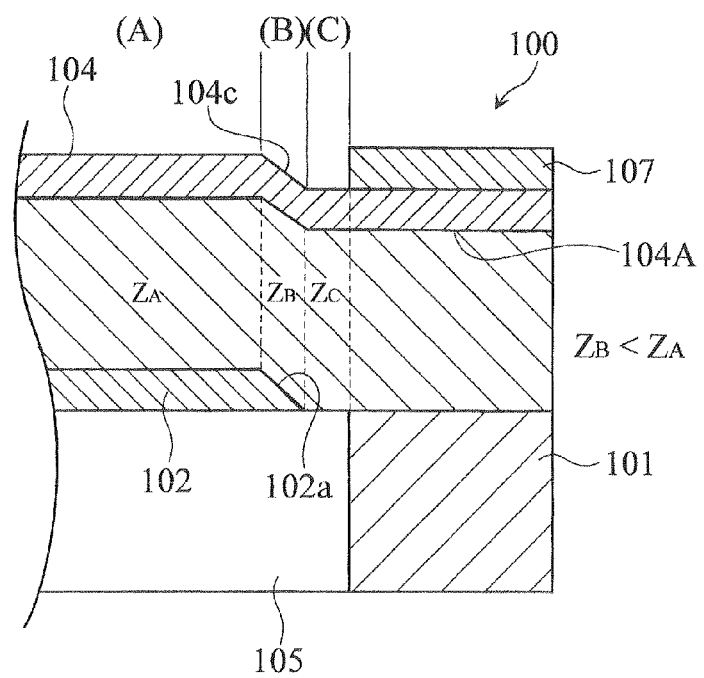
FIG. 29 is a sectional view of a primary portion, illustrating an inclined portion formed at an end of the lower electrode in the structure illustrated in FIG. 27.

Further, the above-described ladder-type band-pass filter may be applied to a branching filter 12 in FIG. 21 which includes a matching circuit 121, a transmission filter 122 and a reception filter 123, with the transmission filter 122 and the reception filter 123 as a target of the application. This will provide the branching filter 12 with such advantages as reduced ripples in the transmission band and in the reception band, as well as reduced loss. It should be noted here that in FIG. 21 the matching circuit 121 is an impedance adjustment circuit which is placed between the antenna terminal and the two filters, i.e. the transmission filter 122 and the reception filter 123, and is provided by e.g. a phase shifter. Since the matching circuit 121 is provided only when needed, it may be eliminated from the branching filter 12.

It should be noted here that the number, layout, etc. of the resonant elements for constituting the filter are not limited to those described above.

In relation to the above-described embodiments, the following configurations are disclosed as appendices.

(Appendix 1) A piezoelectric thin film resonant element provided with a resonant portion of a laminate structure including: a piezoelectric film having a predetermined plan-view shape; a lower electrode formed on a lower surface of the piezoelectric film and having an outer circumference including an inclined portion which is inclined with respect to the surface of the film at a predetermined angle; and an upper electrode formed on an upper surface of the piezoelectric film. The angle of the inclined portion is in a range from 25° through 55°.

(Appendix 2) The piezoelectric thin film resonant element according to Appendix 1, where the inclined portion is provided in part of the outer circumference of the lower electrode.

(Appendix 3) A piezoelectric thin film resonant element provided with a resonant portion of a laminate structure including: a piezoelectric film having a predetermined plan-view shape; a lower electrode formed on a lower surface of the piezoelectric film and having an outer circumference including an inclined portion which is inclined with respect to the surface of the film at a predetermined angle; and an upper electrode formed on an upper surface of the piezoelectric film. Correspondingly in position to the inclined portion of the lower electrode, the resonant portion includes a laminated region having an acoustic impedance greater than an acoustic impedance of a laminated region of the resonant portion inner than the inclined portion of the lower electrode.

(Appendix 4) A piezoelectric thin film resonant element provided with a resonant portion of a laminate structure including: a piezoelectric film having a predetermined plan-view shape; a lower electrode formed on a lower surface of the piezoelectric film and having an outer circumference including an inclined portion which is inclined with respect to the surface of the film at a predetermined angle; and an upper electrode formed on an upper surface of the piezoelectric film. The upper electrode includes a portion opposing the inclined portion and provided with an additional film for a greater lamination thickness of the resonant portion at the inclined portion of the lower electrode than a lamination thickness of a portion of the resonant portion inner than the inclined portion of the lower electrode.

(Appendix 5) The piezoelectric thin film resonant element according to Appendix 4, where the additional film is provided on an upper surface of the upper electrode.

(Appendix 6) The piezoelectric thin film resonant element according to Appendix 5, where the upper electrode is connected to a terminal electrode for external connection, and the additional film is provided on the upper surface of the upper electrode, to extend from the portion opposing the inclined portion onto the terminal electrode.

(Appendix 7) The piezoelectric thin film resonant element according to Appendix 5, where the upper electrode is connected to a terminal electrode for external connection, and the additional film is provided on the upper electrode, to extend from a position inner than the inclined portion of the lower electrode, via the portion opposing by the inclined portion, and onto the terminal electrode of the upper electrode.

(Appendix 8) The piezoelectric thin film resonant element according to any one of Appendix 4 through Appendix 7, where the additional film is an electrical conductor.

(Appendix 9) The piezoelectric thin film resonant element according to any one of Appendix 4 through Appendix 7, wherein provision of the additional film is replaced by making a greater film thickness of a portion where the additional film was provided than a film thickness of the other portion of the upper electrode, so that a partial lamination thickness of the resonant portion at the inclined portion of the lower electrode is greater than a partial lamination thickness of the resonant portion inner than the inclined portion of the lower electrode.

(Appendix 10) A piezoelectric thin film resonant element provided with a resonant portion of a laminate structure including: a piezoelectric film having a predetermined plan-view shape; a lower electrode formed on a lower surface of the piezoelectric film and having an outer circumference including an inclined portion which is inclined at a predetermined angle; and an upper electrode formed on an upper surface of the piezoelectric film. The piezoelectric film includes a portion opposing the inclined portion and having a film thickness greater than a film thickness of a portion of the piezoelectric film opposing an inner region than the inclined portion of the lower electrode, so that a partial lamination thickness of the resonant portion at the inclined portion of the lower electrode is greater than a partial lamination thickness of the resonant portion inner than the inclined portion of the lower electrode.

(Appendix 11) A piezoelectric thin film resonant element provided with a resonant portion of a laminate structure including: a piezoelectric film having a predetermined plan-view shape; a lower electrode formed on a lower surface of the piezoelectric film and having an outer circumference including an inclined portion which is inclined at a predetermined angle; an upper electrode formed on an upper surface of the piezoelectric film; and a dielectric film formed on one or both of a lower surface of the lower electrode and an upper surface of the upper electrode. The dielectric film includes a portion opposing the inclined portion and having a film thickness greater than a film thickness of a portion of the dielectric film opposing an inner region of the resonant portion than the inclined portion of the lower electrode, so that a partial lamination thickness of the resonant portion at the inclined portion of the lower electrode is greater than a partial lamination thickness of the resonant portion inner than the inclined portion of the lower electrode.

(Appendix 12) The piezoelectric thin film resonant element according to any one of Appendix 4 through Appendix 7, Appendix 10 and Appendix 11, where the piezoelectric film is provided with an inclined portion inclined with respect to the surface of the film at a predetermined angle. The inclined portion of the piezoelectric film is at an outer circumference of the resonant portion which has a substantially equal lamination thickness to a lamination thickness of a portion of the resonant portion inner than the inclined portion of the lower electrode, and the outer circumference of the piezoelectric film is located inside of the outer circumference of the upper electrode.

(Appendix 13) The piezoelectric thin film resonant element according to any one of Appendix 4 through Appendix 7, Appendix 10 and Appendix 11, where the angle of the inclined portion is in a range from 25° through 55°.

(Appendix 14) The piezoelectric thin film resonant element according to any one of Appendix 4 through Appendix 7, Appendix 10 and Appendix 11, where the piezoelectric film is provided by aluminum nitride or zinc oxide which has an orientation with a main axis in a (002) direction.

(Appendix 15) The piezoelectric thin film resonant element according to any one of Appendix 1 through Appendix 7, Appendix 10 and Appendix 11, where the plan-view shape of the resonant portion is an ellipsoid or polygon in which no two sides are parallel to each other.

(Appendix 16) A circuit component provided with at least one piezoelectric thin film resonant element according to any one of Appendix 1 through Appendix 7, Appendix 10 and Appendix 11.

According to the piezoelectric thin film resonant element in Appendices 1, 2 and 13, the inclined portion of the lower electrode has an angle in a range from 25° through 55°. This contributes to improving the Q value of the piezoelectric thin film resonant element.

According to the piezoelectric thin film resonant element in Appendices 3, 4, 9 through 11 and 14, the partial laminated region of the resonant portion at the inclined portion of the lower electrode has an acoustic impedance greater than the acoustic impedance of the partial laminated region of the resonant portion inner than the inclined portion of the lower electrode. This contributes to reducing leakage of lateral elastic waves and improving the Q value of the piezoelectric thin film resonant element. Also, the acoustic impedance variation in the resonant portion in a plan view is asymmetrical, which serves to reduce spurious modulation.

According to the piezoelectric thin film resonant element in Appendix 5, providing the additional film can be performed easily, without causing adverse effects on manufacturing process.

According to the piezoelectric thin film resonant element in Appendix 6, the additional film is formed on the terminal electrode as well as on the upper electrode. Thus, when the additional film is made of an electroconductive material, the above arrangement can reduce the resistance of the terminal electrode and the upper electrode. Accordingly, it is possible to further improve the Q value of the piezoelectric thin film resonant element.

According to the piezoelectric thin film resonant element in Appendix 7, a desired film thickness can be achieved in the additional film on the upper electrode at the location opposed by the inclined portion of the lower electrode. This contributes to improving the Q value of the piezoelectric thin film resonant element and reducing energy loss and spurious modulation.

According to the piezoelectric thin film resonant element in Appendix 8, the terminal electrode formed integral with the upper electrode can have a reduced resistance. This is advantageous in improving the Q value of the piezoelectric thin film resonant element.

According to the piezoelectric thin film resonant element in Appendix 12, the outer circumference of the piezoelectric film is located inside of the outer circumference of the upper electrode at a region where a circumferential portion of the resonant portion has an acoustic impedance not higher than that of the central portion. This increases the antiresonant impedance and reduces leakage of lateral elastic waves in this region. This further improves the Q value of the piezoelectric thin film resonant element.

According to the piezoelectric thin film resonant element in Appendix 15, it is possible to reduce spurious modulation to a certain extent. This provides a piezoelectric thin film resonant element with further reduction in spurious modulation.

According to the circuit component in Appendix 16, it is possible to provide a circuit component such as a filter or a branching filter featuring reduced spurious modulation and low loss.

The invention claimed is:

1. A piezoelectric thin film resonant element comprising a resonant portion and a non-resonant portion adjacent to the resonant portion, the resonant portion having a laminate structure including:
a piezoelectric film having a predetermined plan-view shape;
a lower electrode formed on a lower surface of the piezoelectric film and having an edge formed with an inclined portion which is inclined with respect to a surface of the film at a predetermined angle;
an upper electrode formed on an upper surface of the piezoelectric film; and
an additional film formed on the upper electrode at a position corresponding to the inclined portion of the lower electrode; the piezoelectric thin film resonant element also comprising a substrate supporting the resonant portion,
wherein a cavity is provided under the lower electrode, the cavity extending through the resonant portion and into the non-resonant portion, and at least part of the additional film is disposed at a position offset from an end of the cavity toward a center of the cavity,
wherein the resonant portion has a greater acoustic impedance at a part of the laminate structure corresponding to the inclined portion of the lower electrode than a part of the laminate structure inner than the inclined portion of the lower electrode.

2. The piezoelectric thin film resonant element according to claim 1, wherein the piezoelectric film is made of aluminum nitride or zinc oxide having an orientation with a main axis in a (002) direction.

3. A circuit component comprising at least one piezoelectric thin film resonant element in accordance with claim 1.

4. A piezoelectric thin film resonant element comprising:
a resonant portion having a laminate structure including: a piezoelectric film having a predetermined plan-view shape; a lower electrode formed on a lower surface of the piezoelectric film and having an edge formed with an inclined portion which is inclined with respect to a surface of the film at a predetermined angle; and an upper electrode formed on an upper surface of the piezoelectric film;
a non-resonant portion adjacent to the resonant portion; and
an additional film formed on the upper electrode at a position corresponding to the inclined portion of the lower electrode, wherein the upper electrode includes an inclined portion at a position corresponding to the inclined portion of the lower electrode, the additional film being provided at least on the inclined portion of the upper electrode,
wherein a cavity is provided under the lower electrode, the cavity extending through the resonant portion and into the non-resonant portion, and at least part of the additional film is disposed at a position offset from an end of the cavity toward a center of the cavity,
wherein the upper electrode includes an exposed portion that is not covered with the additional film, the exposed portion being located in the resonant portion.

5. The piezoelectric thin film resonant element according to claim 4, further comprising a terminal electrode connected to the upper electrode, wherein the additional film extends from the inclined portion of the upper electrode onto the terminal electrode.

6. The piezoelectric thin film resonant element according to claim 4, further comprising a terminal electrode connected to the upper electrode, wherein the additional film extends from an inner position relative to the inclined portion of the upper electrode onto the terminal electrode.

7. The piezoelectric thin film resonant element according to claim 4, wherein the piezoelectric film is provided with an inclined portion at an outer circumference of the resonant portion, the inclined portion of the piezoelectric film being inclined with respect to a surface of the piezoelectric film at a predetermined angle, the piezoelectric film including an outer circumference arranged inner than an outer circumference of the upper electrode.

8. The piezoelectric thin film resonant element according to claim 4, wherein the angle of the inclined portion of the lower electrode lies in a range from 25° through 55°.

9. The piezoelectric thin film resonant element according to claim 4, wherein the piezoelectric film is made of aluminum nitride or zinc oxide having an orientation with a main axis in a (002) direction.

10. A circuit component comprising at least one piezoelectric thin film resonant element in accordance with claim 4.

11. The piezoelectric thin film resonant element according to claim 1, wherein an angle of the inclined portion lies in a range from 25° through 55°.

12. The piezoelectric thin film resonant element according to claim 11, wherein the inclined portion is provided in part of said edge of the lower electrode.

13. The piezoelectric thin film resonant element according to claim 11, wherein the piezoelectric film is made of aluminum nitride or zinc oxide having an orientation with a main axis in a (002) direction.

14. The piezoelectric thin film resonant element according to claim 8, wherein the inclined portion of the lower electrode is provided in part of said edge of the lower electrode.

* * * * *